(12) United States Patent
Johnson et al.

(10) Patent No.: US 8,160,284 B2
(45) Date of Patent: Apr. 17, 2012

(54) AMPLIFICATION CIRCUIT AND HEARING AID

(75) Inventors: William A. Johnson, Roseville, MN (US); Mead C. Killion, Elk Grove Village, IL (US)

(73) Assignee: Etymotic Research, Inc., Elk Grove Village, IL (US)

( * ) Notice: Subject to any disclaimer, the term of this patent is extended or adjusted under 35 U.S.C. 154(b) by 824 days.

(21) Appl. No.: 12/207,317

(22) Filed: Sep. 9, 2008

(65) Prior Publication Data

US 2010/0061576 A1    Mar. 11, 2010

(51) Int. Cl.
*H04R 25/00* (2006.01)
(52) U.S. Cl. ........................ 381/321; 381/312
(58) Field of Classification Search .................. 381/312, 381/315–321
See application file for complete search history.

(56) References Cited

U.S. PATENT DOCUMENTS

| | | | |
|---|---|---|---|
| 3,995,114 A | 11/1976 | Marschinke | |
| 4,592,087 A | 5/1986 | Killion | |
| 4,629,833 A | 12/1986 | Kern et al. | |
| 4,689,819 A | 8/1987 | Killion | |
| 4,952,867 A | 8/1990 | Anderson et al. | |
| 5,131,046 A | 7/1992 | Killion et al. | |
| 5,631,965 A | 5/1997 | Chang et al. | |
| 5,745,587 A | 4/1998 | Statz et al. | |
| 5,838,807 A | 11/1998 | Andersson et al. | |
| 2005/0018866 A1 | 1/2005 | Schulein et al. | |

OTHER PUBLICATIONS

Johnson and Killion "Is Class D better than Class B?" Amer. J. Audiology, Mar. 1994, 11-13, at http://www.etymotic.com/pdf/erl-0027-1994.pdf.
Notification Concerning Transmittal of International Preliminary Report on Patentability (Chapter I of the Patent Cooperation Treaty) dated Mar. 24, 2011 in International application No. PCT/US2009/053140.

*Primary Examiner* — Suhan Ni
(74) *Attorney, Agent, or Firm* — McAndrews, Held & Malloy, Ltd.

(57) ABSTRACT

Certain embodiments of the present technology provide improved amplification circuits and hearing aids that can utilize such amplification circuits. In an embodiment, for example, an amplification circuit includes: a first sub circuit configured to create a voltage drop when a supply voltage is above a first voltage; and a second sub circuit configured to create a reverse voltage drop when the supply voltage is below a second voltage, wherein the first and second sub circuits operate to maintain idling current within a range. Certain embodiments of the present technology also provide hearing aids that include removable dampers.

12 Claims, 22 Drawing Sheets

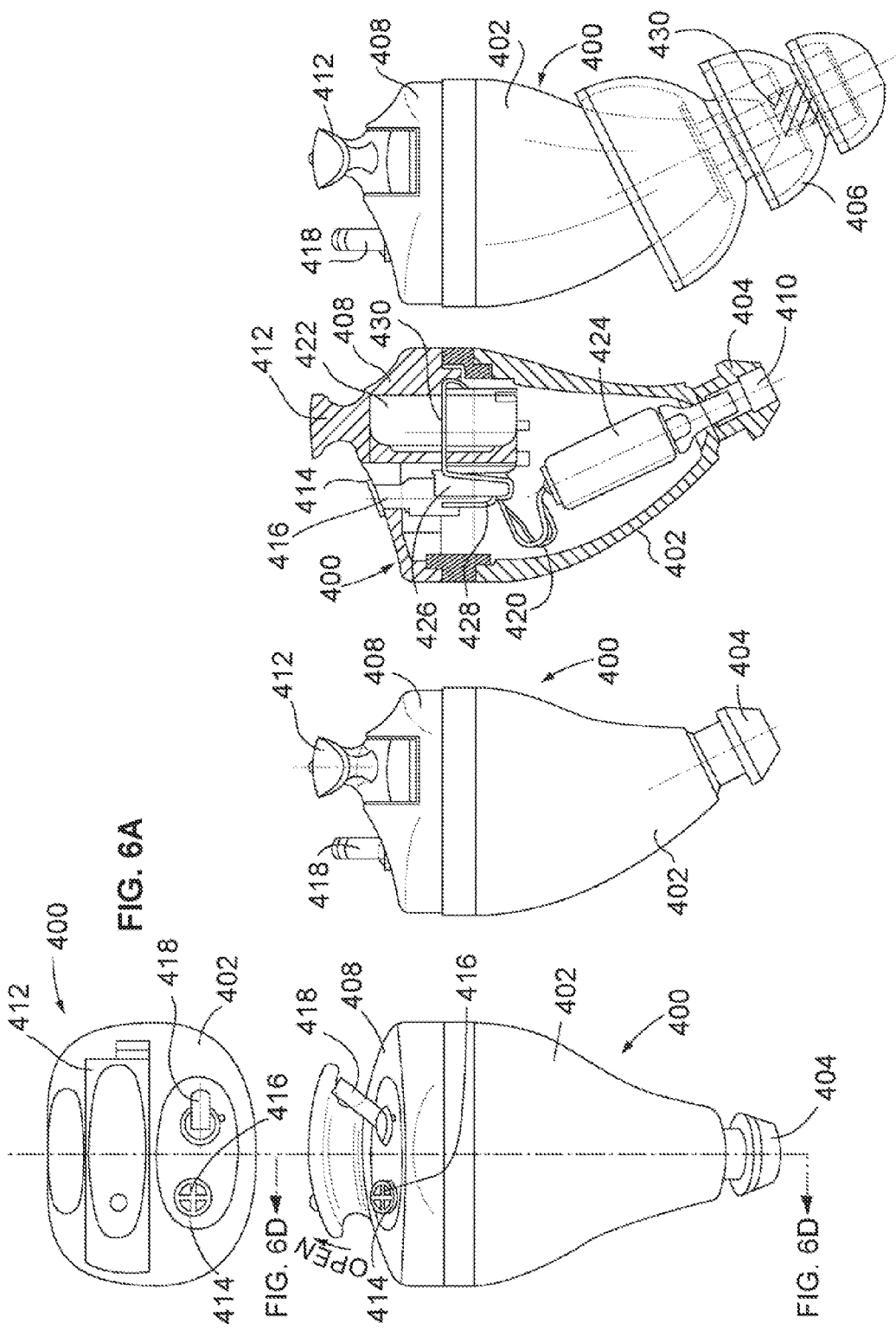

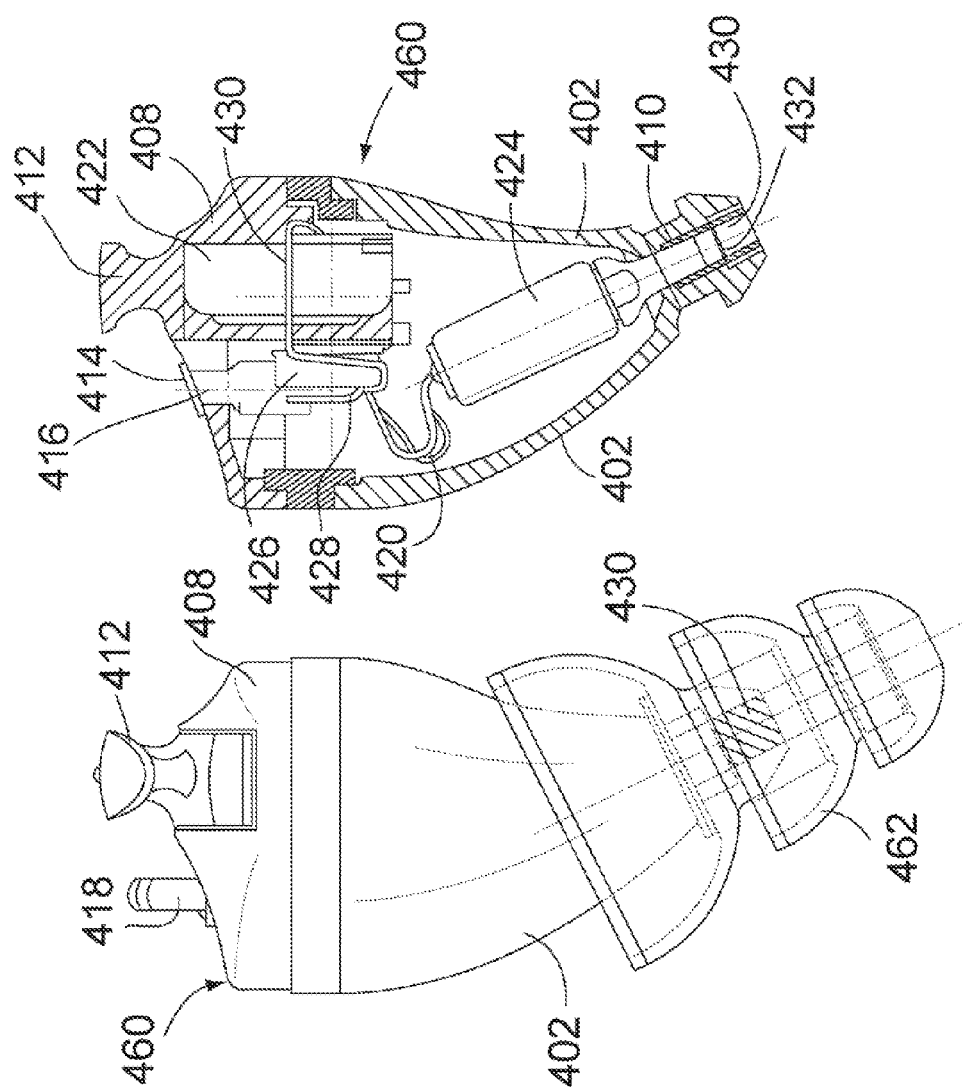

Frequency response of wideband and with conventional (·······) and 6R12 (———) earmolds, measured with a 2 cm³ coupler (HA-1 configuration).

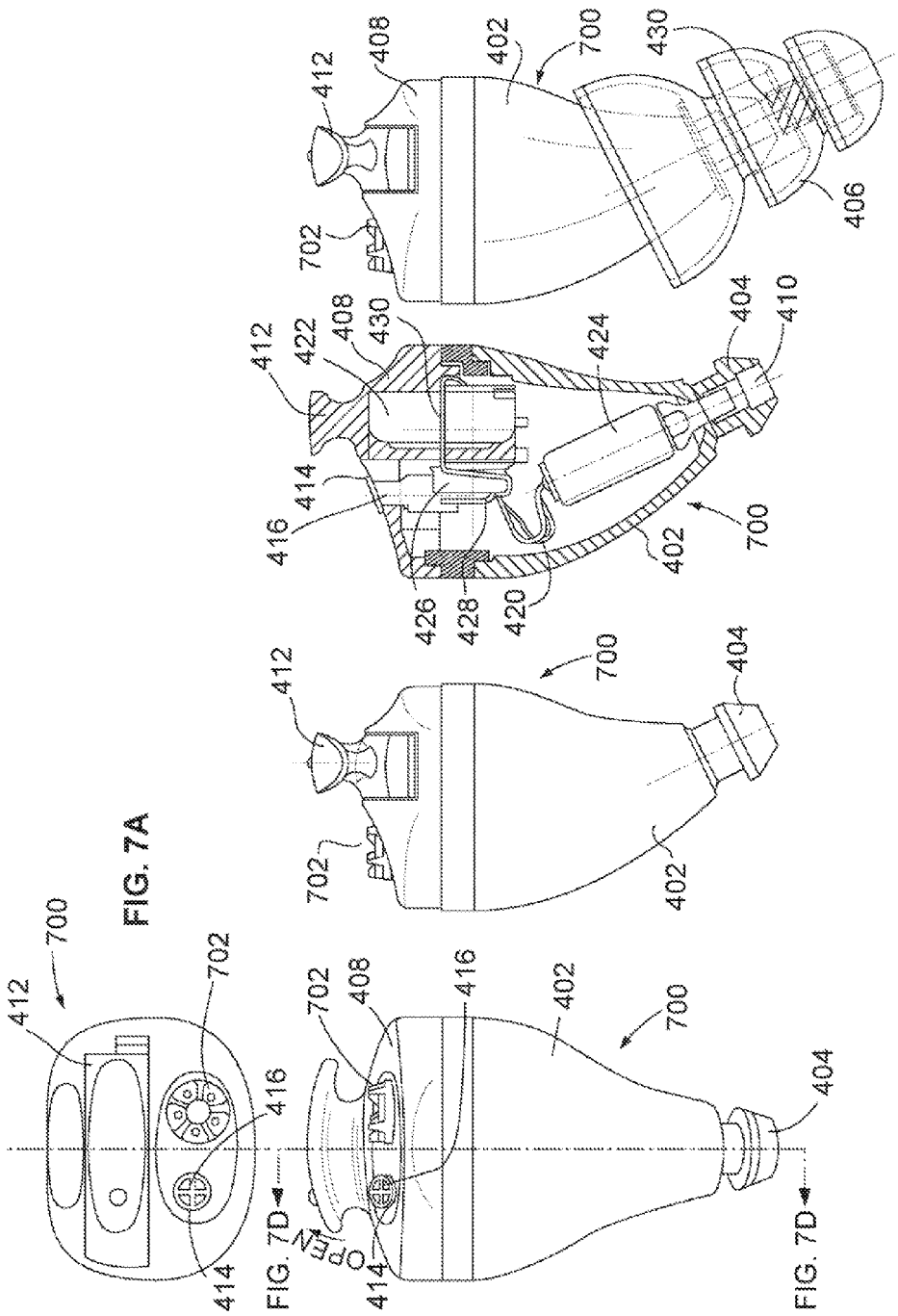

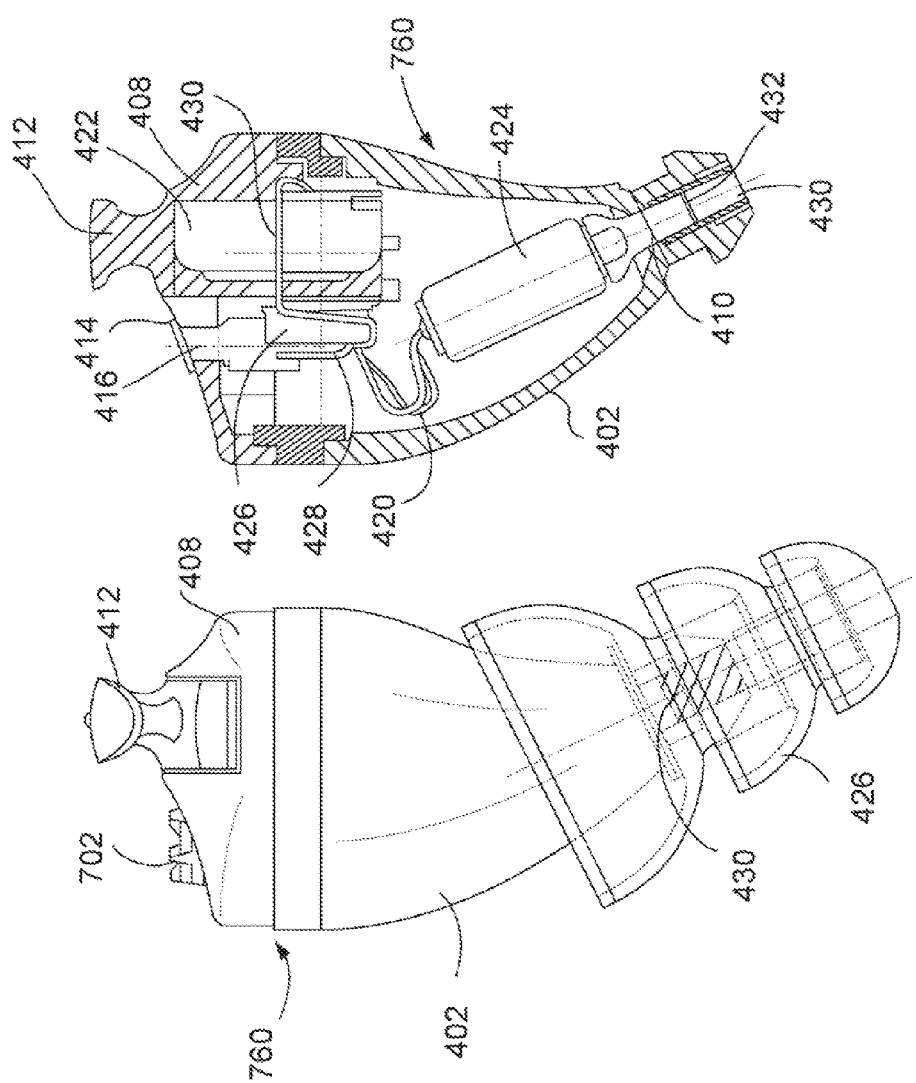

AMPLIFICATION CIRCUIT AND HEARING AID

RELATED APPLICATIONS

This application makes reference to the U.S. Patents identified below, which patents are hereby incorporated herein by reference in their entirety:
U.S. Pat. No. 3,588,383, filed Feb. 9, 1970;
U.S. Pat. No. 3,701,865, filed Jun. 25, 1971;
U.S. Pat. No. 4,170,720, filed Mar. 3, 1978;
U.S. Pat. No. 4,592,087 filed Dec. 8, 1983;
U.S. Pat. No. 4,689,819 filed Mar. 19, 1986;
U.S. Pat. No. 4,852,683, filed Jan. 27, 1988;
U.S. Pat. No. 5,131,046, filed Nov. 3, 1989
U.S. Pat. No. 5,113,967, filed May 7, 1990;
U.S. Pat. No. 5,144,675, filed Mar. 30, 1990;
U.S. Pat. No. 5,887,070, filed Dec. 19, 1996;
U.S. Pat. No. 6,666,295, filed Jan. 23, 2001; and
U.S. Pat. No. 6,830,876, filed Nov. 10, 2003.

This application also makes reference to the U.S. patent application Ser. No. 11/031,915, filed Jan. 7, 2005 and published as 2005/0147267, which patent application is hereby incorporated herein by reference in its entirety.

UNITED STATES PATENT FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Despite the availability of technically advanced hearing aids, some of which are fully digital hearing aids, up to 80% of individuals who admittedly need hearing aids do not obtain them.

This has been true even though high-fidelity hearing aids are commercially available. One example of such a hearing aid is the K-AMP® hearing aid, elements of which are described, for example, in U.S. Pat. Nos. 4,170,720 and 5,131,046, and 5,144,675. Experimental testing has indicated that the K-AMP® hearing aid provides a fidelity that exceeds other digital or analog hearing aids. One measure of K-AMP® hearing aid's fidelity is that four members of the Chicago Symphony Orchestra—including a former concertmaster of the CSO and the principal of the $2^{nd}$ violin section of the CSO—wore K-AMP® hearing aids on stage and off until they retired a few years ago. At one time, an estimated 18-20% of all hearing aids in the U.S. were K-AMP® hearing aids. As one internationally known professor stated: the K-AMP® "had an incredible and indelible worldwide influence on how hearing aids should be designed, selected and fitted" (Gus Mueller, Ph.D., quoted in Etymotic Research: 25 Years of Research & Product Development for the Ear, 2008). Unfortunately, K-AMP® hearing aids have required relatively expensive Class D amplifiers and receivers in order to provide their high-fidelity performance at high input levels. Examples of such Class D amplifiers and receivers are described, for example, in U.S. Pat. Nos. 4,592,087 and 4,689,819, issued to Killion.

Experimental testing has shown that the highest intelligibility in noise was obtained with hearing aids judged to have the highest sound quality, both by those with normal hearing and those with hearing loss (flat or sloping). In fact, the highest intelligibility was the natural sound of the open ear, which provided better fidelity and better intelligibility in noise than roughly half of the second-generation digital aids often described (inaccurately) as having "CD quality." Experimental data supporting this finding is shown in FIG. 1A, which is a reproduction of FIGS. 7 and 8 from Killion M C, "Myths that Discourage Improvements in Hearing Aid Design," The Hearing Review, 11, No. 1, 32-40, 70 (2004). The validity of these fidelity ratings is illustrated in FIG. 1B, where the fidelity rating listeners gave to the sound of some digital hearing aids is compared to the "25-Band Accuracy Score" calculated from the frequency response as described by Killion in 1979 (reference 8 in the "Myths" paper given above). Other experiments have attempted to rate the dollar value of the sound of some digital hearing aids. The sound quality of the majority of these aids was rated as being worth much less than their typical cost of $2,000-$3,000 each, as shown in FIG. 1C taken from the same paper. Dollar value for music reproduction is only one dimension in hearing aid value of course, but the relationship shown above between intelligibility in noise and fidelity suggests that part of the reason for hearing aids remaining in dresser drawers (i.e., going unused) may be unsatisfactory sound quality.

Nonetheless, the question of why 80% of those who need hearing aids go without them remains unanswered. There are many stated reasons for this phenomenon. Among them are: (1) a friend or relative purchased a hearing aid that ended up in a dresser drawer because it did not live up to the buyer's expectations; (2) the person needing a hearing aid didn't want to see a licensed professional (a licensed professional dispensing hearing aids is required by regulations in all but two states); and/or (3) a hearing aid was considered too expensive to afford, or simply too expensive. For example, one may hear comments such as "I can buy a top-of-the-line refrigerator for a few hundred dollars. Why should I have to pay more for a hearing aid?"

Whatever the reason, about 24 million people are going without hearing aids. Unfortunately, those persons and their friends and relatives suffer the consequences. As one author stated, "No one goes without hearing aids—they simply force their spouse to holler at them." This makes for less than friendly and loving conversations: It is hard to feel warm and fuzzy when someone is shouting at you. And it is hard to feel warm and fuzzy when you have to shout at them. Emotions aside, the cost of unaided hearing loss has been estimated to be $2,500 annually in income for those with mild-moderate hearing loss and $5,600 annually for those with moderate loss (Sergei Kochkin, "The impact of untreated hearing loss on household income"). Nationally, this is perhaps $50 billion dollars in lost income.

Of the three reasons listed above for not buying hearing aids, the first can be handled by improving the sound quality of hearing aids and—most important—making every effort to induce expectations that are consistent with what the person will experience. In many cases, the person who does come in for hearing aids has two problems: inability to hear quiet sounds, and inability to hear in loud restaurants and the like. The first can be solved completely for most persons with most hearing aids. The second, when severe, can be solved by use of a remote FM or other microphone near the talker, where the signal-to-noise ratio at the microphone can be 20 dB better than at the listener's hearing aid microphone. A detailed discussion of "SNR loss" is beyond the scope of this application, but some 20% of all hearing aid wearers have sufficient SNR loss so they cannot understand speech in a noisy restaurant or cocktail party with or without their hearing aids.

(Some report they hear better in those environments when they take their hearing aids off: It is so loud that everything is already audible, and their hearing aids make things even harder to understand.) If the pretty pictures and advertising copy lead people to expect they will hear better in noise with their hearing aids, those with severe SNR loss will surely be disappointed. Various lecturers have suggested that a satisfied person tells three other people, but a dissatisfied person tells 13 (one recent book title suggested a larger ratio: Peter Blackshaw, "Satisfied Customers Tell Three Friends, Angry Customers Tell 3,000)." To the extent that these ratios apply to hearing aid purchasing, even 20% of hearing aid purchasers may be sufficient to discourage a large portion of the 80% who don't purchase hearing aids. Industry statistics indicate some 15% of hearing aids are returned for credit as unsatisfactory to the purchaser. Some estimates indicate that another 14% end up in dresser drawers (Sergei Kochkin, "The VA and Direct Mail Sales Spark Growth in Hearing aid Market," Hearing Review, December 2001).

Fortunately, it is not hard to prominently state in the description of a hearing aid that those with severe loss of ability to hear in noise will be able to hear quiet sounds better, but will need additional assistance in noisy surroundings. To the applicant's knowledge, no hearing aid advertisements make such a candid statement, but it is certainly just as appropriate for a low-cost hearing aid as for a hearing aid costing $3,000.

The second and third reasons for not obtaining hearing aids (need to see a professional and high cost) can be taken care of simultaneously, since the majority of the cost of hearing aids is the cost of the professional dispensing process. Before discussing the cost of a traditional hearing aid, it should be stated that this discussion is not in any way meant to disparage that process. There is no question that the means to the best possible hearing aid fitting is to see someone who understands hearing and hearing aids, and has demonstrated this understanding in the process of obtaining advanced degrees and a dispensing license. And much of the "soft" part of the dispensing is the teaching—which can only be done first hand—of the fact that the brain will "rewire" to accommodate the initially unnatural sound of the hearing aid and the fact that any change to the auditory input may make it sound to some new wearers as if they are listening to speech in a sea of noise. Not to mention simply putting the battery in right, which can be a major challenge for some persons. In good hands, the process is skilled, caring, and even so may require one or more readjustments of the hearing aid response or processing.

In traditional hearing aid fitting, there are two components to the "fitting" process: Taking impressions and obtaining an earmold (usually but not always custom) fitted to the external ear, plus adjusting the analog or digital signal processing to compensate for the individual characteristics of the hearing loss, for example, "flat loss" (approximately the same loss at all frequencies), "high frequency loss" (significantly greater loss at high frequencies than at low frequencies), "ski slope loss" normal or near normal low-frequency hearing with precipitous drop to moderate-severe high-frequency loss, etc. In the normal fitting of a hearing aid, the frequency response of the hearing aid is adjusted at each level to compensate for the loss at that level. Various "fitting formulae" have been developed to provide appropriate targets based on the shape and degree of the hearing loss. One such popular fitting target called FIG. 6 was developed by applicant Killion.

These two fitting processes typically require two or three visits and the attention of licensed skilled professionals, often with doctorate degrees. The advantage of the traditional fitting method is a better fitting than may be obtained in a one-size-fits-many ready-fit hearing aid design. The disadvantage is cost: The total cost of the basic hearing aid itself plus the professional fees typically add up to $3,000 to $8,000 for a pair of hearing aids.

For those who won't see a professional for a traditional hearing aid, however, the above advantages are never experienced: the person is without amplification. For such individuals, an inexpensive hearing aid that is simple to use, especially if a trial purchase is encouraged by allowing the purchaser to return the aid if they are not satisfied, may encourage a trial of hearing aids. Moreover, it seems likely that after experiencing the improved audibility of too-quiet sounds, those with sufficient resources may well be inclined to see a professional for even better hearing aids.

Interestingly enough, applicant Killion has had two recent conversations that suggest cost can be the deciding factor even when adequate funds are available. At the Oshkosh, Wis., EAA air show, a conversation around a picnic table with four pilots in their 60s and 70s indicated that all four could use hearing aids but had never gone to get them. When the discussion of a high-quality ready-fit hearing aid for $300 came up, all were interested and two said eagerly "tell me where I can get one." All would try a do-it-yourself $300 hearing aid, yet none planned to go get a $3,000 hearing aid. Each of these men owned, or had previously owned, private airplanes costing in excess of $100,000. Similarly, at Chautauqua, N.Y., Institution, where the cost of registration, transportation and lodging for a week typically exceeded $2,500, a conversation around another picnic table with four high-intellect women in their 60s and 70s (one perhaps in her 80s) indicated that, again, all could benefit from hearing aids, but did not intend to go get one. Yet all were keenly interested in a $300 hearing aid of good quality (even if it didn't have all the digital features so popular today).

After concluding that cost and "seeing a professional" were major factors in discouraging many persons from seeking hearing aid help, applicant Killion, who has taught the advanced hearing aid electroacoustics course to Northwestern University audiological graduate students for 25 years, and his colleague, Dr. Gail Gudmundsen, who has dispensed over 10,000 hearing aids over the years, applied to the FDA for creation of a new category of hearing aid that can be purchased over the counter ("OTC"). See, http://webreprints-.djreprints.com/1257230721151.html, Wall Street Journal. These OTC hearing aids were meant to be self-fitted by the self-selection of eartips, much as applicant Killion's company's high-fidelity earphones are fitted by the user as described, for example, in U.S. Pat. No. 5,887,070, entitled "High fidelity insert earphones and methods of making same," issued to Iseberg et al., and on the Internet at http://www.etymotic.com/ephp/epcomp.aspx. The application to the FDA was denied, but the problem remains unsolved.

Applicant Killion has published three papers summarizing many probable reasons for hearing aid failure, but certainly the unnatural sound of many aids appears to be an important one. See Killion M C, "Myths that Discourage Improvements in Hearing Aid Design," The Hearing Review, 11, No. 1, 32-40, 70, 2004; Killion M C, "Myths About Hearing in Noise and Directional Microphones," The Hearing Review, 11, No. 2, 14-19, 72-73, 2004, and Killion M C, "Myths about Hearing Aid Benefit and Satisfaction," The Hearing Review, 11, No. 8, 14-20, 66, 2004.

All of these considerations suggest that a low-cost one-size-fits-many hearing aid might result in substantially improved lives for many of those who don't presently obtain hearing aids but need them, especially if it minimized the need for several weeks of brain rewiring required to get used to the unnatural sound of some digital hearing aids.

A principle limitation has been the unavailability of a low-power output circuit compatible with the analog bipolar circuit used in K-AMP® hearing aids, which have required more costly Class D circuits. Also, while digital hearing aid circuits have employed switching outputs comparable in efficiency to Class D switching outputs, the overhead current for digital circuits is large, wiping out the possible advantage to the switching output. Finally, battery life of many digital hearing aids is only one week and that of many Completely In the Canal ("CIC") hearing aids is often only 3 days.

Thus, there is a need for a low-cost hearing aid that exhibits acceptable performance characteristics including improved sound quality and extended battery life.

BRIEF SUMMARY OF THE INVENTION

Certain embodiments of the present technology provide improved amplification circuits and hearing aids that can utilize such amplification circuits. Certain embodiments of the present technology also provide hearing aids that include removable dampers.

BRIEF DESCRIPTION OF SEVERAL VIEWS OF THE DRAWINGS

FIG. 6A is a top view of a hearing aid used in accordance with an embodiment of the present technology.

FIG. 6B is a side view of the hearing aid shown in FIG. 6A.

FIG. 6C is a side view of the hearing aid shown in FIG. 6A.

FIG. 6D is a side-sectional view of the hearing aid shown in FIG. 6A.

FIG. 6E is a side view of the hearing aid shown in FIG. 6A with an eartip attached thereto.

FIG. 6J is a side view of a hearing aid used in accordance with an embodiment of the present technology.

FIG. 6K is a side sectional view of the hearing aid shown in FIG. 6J without the eartip attached thereto.

FIG. 7A is a top view of a hearing aid used in accordance with an embodiment of the present technology.

FIG. 7B is a side view of the hearing aid shown in FIG. 7A.

FIG. 7C is a side view of the hearing aid shown in FIG. 7A.

FIG. 7D is a side-sectional view of the hearing aid shown in FIG. 7A.

FIG. 7E is a side view of the hearing aid shown in FIG. 7A with an eartip attached thereto FIG. 7F is a side view of a hearing aid used in accordance with an embodiment of the present technology.

FIG. 7G is a side sectional view of the hearing aid shown in FIG. 7F without the eartip attached thereto.

Figure 1A:
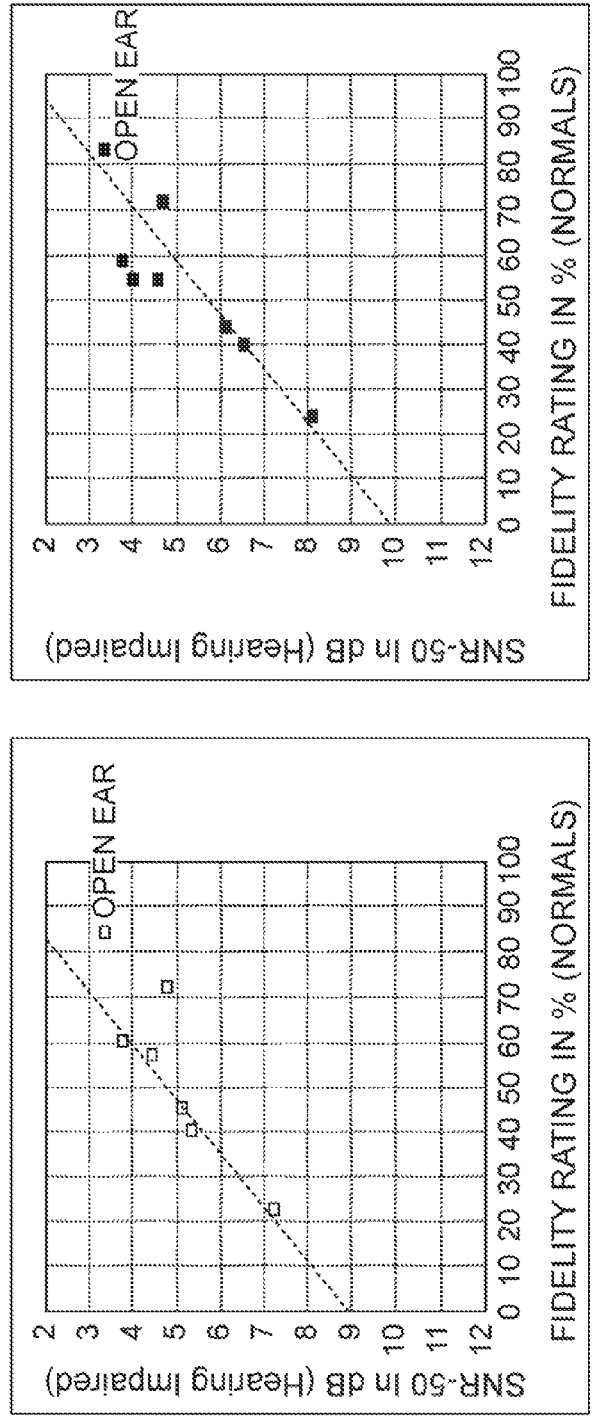
FIG. 1A depicts graphs relating to myths that discourage improvements in hearing aid design.

The foregoing summary, as well as the following detailed description of embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF THE INVENTION

Applicants set out to determine if it was possible to incorporate the bipolar transistor circuit utilized in K-AMP® hearing aids in a low-cost integrated circuit. The aforementioned Class D amplifier that was used in previous K-AMP® hearing aids, was realized with CMOS integrated circuits, and was relatively expensive. Applicants concluded that a bipolar Class B circuit may be capable of being used in connection with the desired low-cost integrated circuit, however, numerous design challenges would need to be overcome. As to battery life, in many instances, Class B and Class D amplifiers can produce a 7-10 times increase in battery life over a Class A amplifier designed with good fidelity (which many Class A amplifiers are not). See, for example, applicant's Johnson and Killion "Is Class D better than Class B?" Amer. J. Audiology March 1994 11-13, also see http://www.etymotic.com/pdf/erl-0027-1994.pdf.

An analysis of previous Class B hearing aid amplifiers was accordingly undertaken in order to identify problems that can prevent such hearing aid amplifiers from providing satisfactory performance characteristics.

One such previous hearing aid amplifier is described in U.S. Pat. No. 3,995,114, entitled "Ultra Low Current Amplifier," which issued to Marschinke. As shown in FIG. 2A (Marschinke's FIG. 1), a pair of transistors, one PNP 30 and one NPN 31, is connected in series between the positive supply and ground. By adjusting resistor 33 to provide a low idling current, and using feedback to linearize the operation, a low-distortion Class B push-pull operation could be obtained under certain conditions. As shown, a large coupling capacitor is required to block the amplifier's DC bias voltage from being impressed on the receiver.

By using a second amplifier in a "bridge" configuration with the first, Marschinke was able to connect the receiver between the outputs of the two amplifiers and eliminate the need for the large coupling capacitor. This is because the amplifier's DC bias can be impressed onto both sides of the receiver resulting in a zero bias current condition across the receiver. Also, this dual amplifier configuration doubles the maximum output voltage that can be delivered to the receiver. This means a higher impedance receiver can be used for a comparable output, thus reducing the required drive current.

However, the Marschinke amplifier exhibits certain characteristics that can undermine modern, efficient manufacturing processes. In particular, both the original Marschinke circuit and the two-amplifier bridge configuration suffered from a large change in idling current through series transistors 30 and 31. For example, at a supply voltage from cell 10 of 1.3 Volts, certain discrete transistors might each have a Base-Emitter voltage of 550 mV at a desired idling current such as 50 uA. The difference between the 1.1 Volt sum of those two voltages and the supply voltage required that resistor 33 be chosen to provide a 0.2 Volt drop. With a transistor beta (sometimes called hfe) of 100, the resulting 0.5 uA current would correspond to a value of 400 kOhm for resistor 33. Note that the feedback resistor 44 would provide a DC signal to transistor 21 and hence to transistor 24 to adjust the voltage at the Bases of the output transistors (30 and 31) to assure that their collector currents are equal.

Applicants have found that one problem with the Marschinke circuit is that there is no compensation for the 2.2 mV per degree C. temperature coefficient of the Base-Emitter voltages of Transistors 30 and 31. Thus, an increase of 18 deg C. would cause a 40 mV drop in VBE of both transistors 30 and 31, which would increase the 200 mV drop across resistor 33 and, taking into account the VBE voltage change with current, decrease the idling current approximately 30% above the design nominal. Conversely, a decrease of 18 deg C. would cause a 40 mV increase in VBE of both transistors, which would decrease the idling current approximately 30%. However, in connection with Class B amplifiers, it can be desirable to maintain a stable idling current across temperature, device-to-device variations and supply voltage in order to maintain output capability and low distortion of the class B amplifier circuit. In some In-The-Ear (ITE) hearing aid applications, a certain amount of temperature dependence may be acceptable since only the surface of the hearing aid is exposed and the portion inside the ear canal is maintained at approximately body temperature by contact with the ear canal. Thus, even with outside temperatures of −18 deg C. (0 deg Fahrenheit), the hearing aid circuit was unlikely to drop more than 5-10 deg C. In Behind The Ear hearing aids, on the other hand, much of the surface of the hearing aid is exposed and an uncompensated temperature coefficient may cause an audible degradation in performance.

Figure 2A:
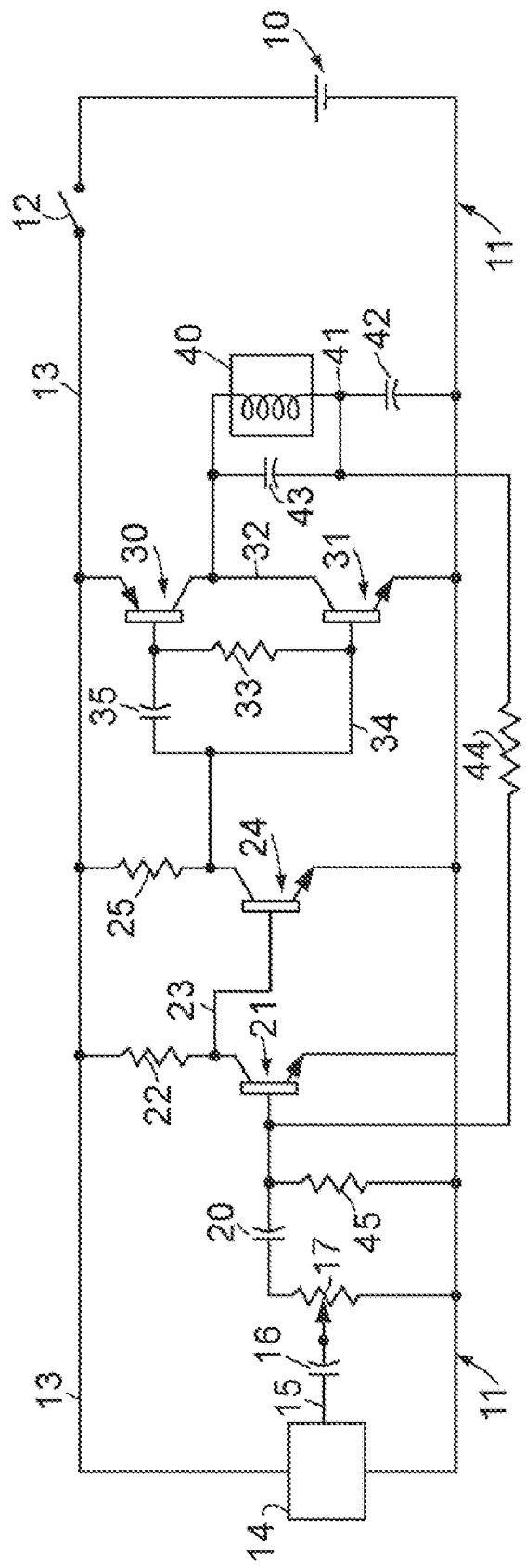
FIG. 2A depicts a prior art amplification circuit.
Figure 2B:
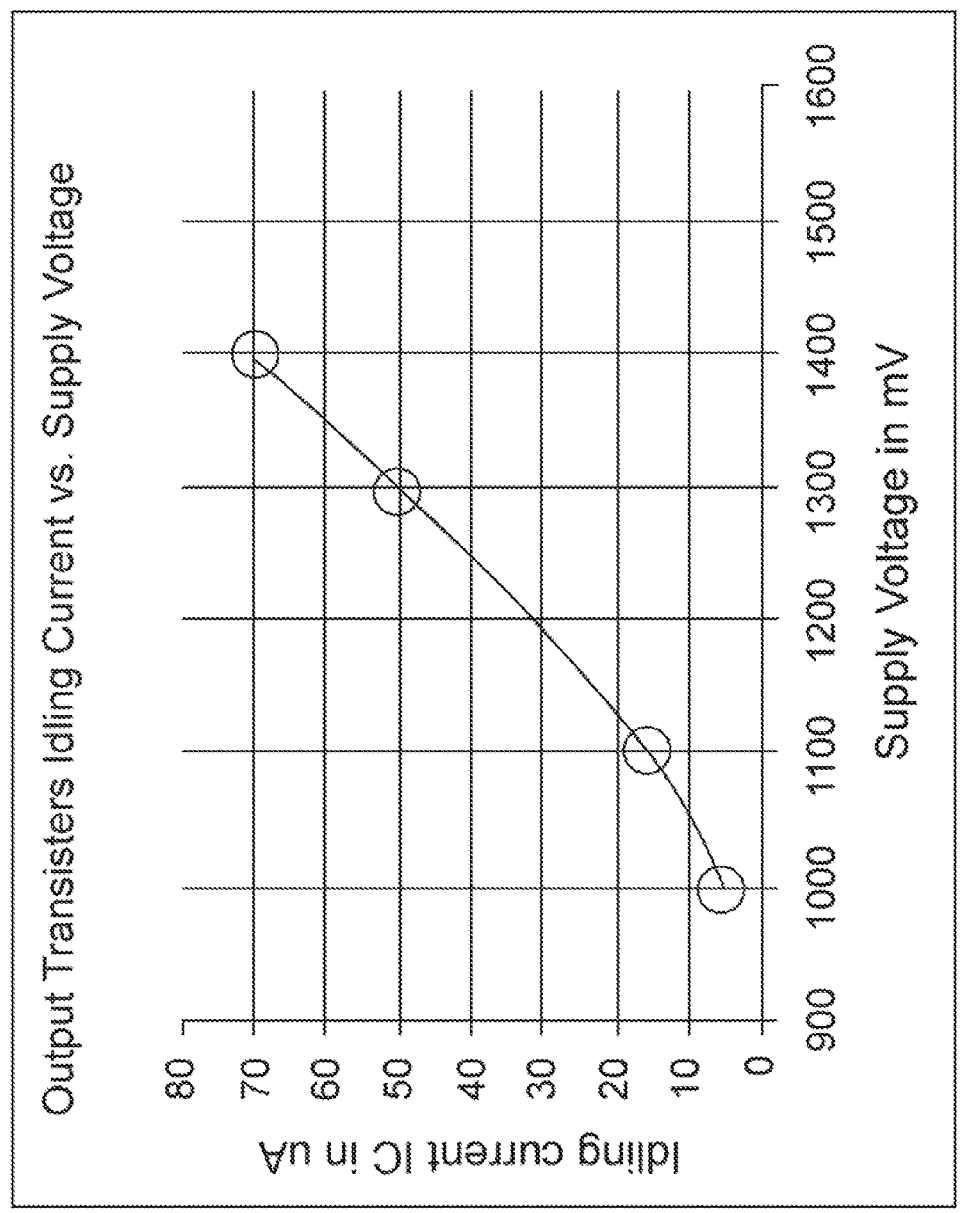
FIG. 2B depicts the calculated idling current as a function of supply voltage in the prior art amplification circuit shown in FIG. 2A.

Applicants have found that a more serious limitation is the fact that the Marschinke circuit has no means to maintain adequate current with battery voltage fluctuation. In the example above where stable operation has been obtained at 1.3 V (1300 mV) and resistor 33 in FIG. 2A is chosen to produce an idling (no signal) current of 50 uA, a fresh cell providing 1.4 V would increase the calculated idling current to 70 uA, as shown in FIG. 2B. Further, when the battery voltage drops to 1.1 Volt, the calculated idling 15 uA current in transistors 30 and 31 would provide a high-crossover-distortion operation. If the supply voltage drops to 1 V (1000 mV), the calculated idling current drops to 10% of the nominal value: the available idling current would be too low to prevent severe crossover distortion.

A further disadvantage of the Marschinke circuit is its use of a Class A driver (transistor 24) to supply drive to the output transistors 30 and 31, such that the driver transistor 24 would have an idling current comparable to the output stage in order to provide sufficient drive to the output transistors 30 and 31.

Figure 2C:
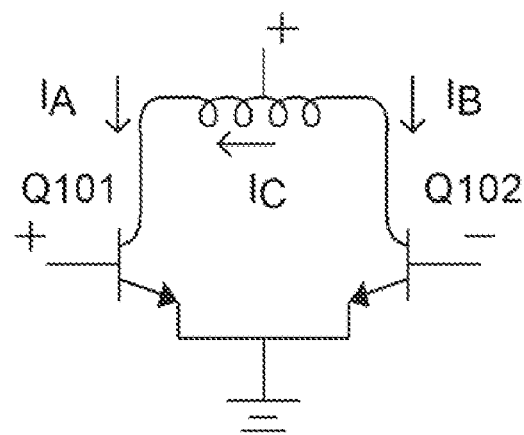
FIG. 2C depicts a prior art amplification circuit.
Figure 2D:
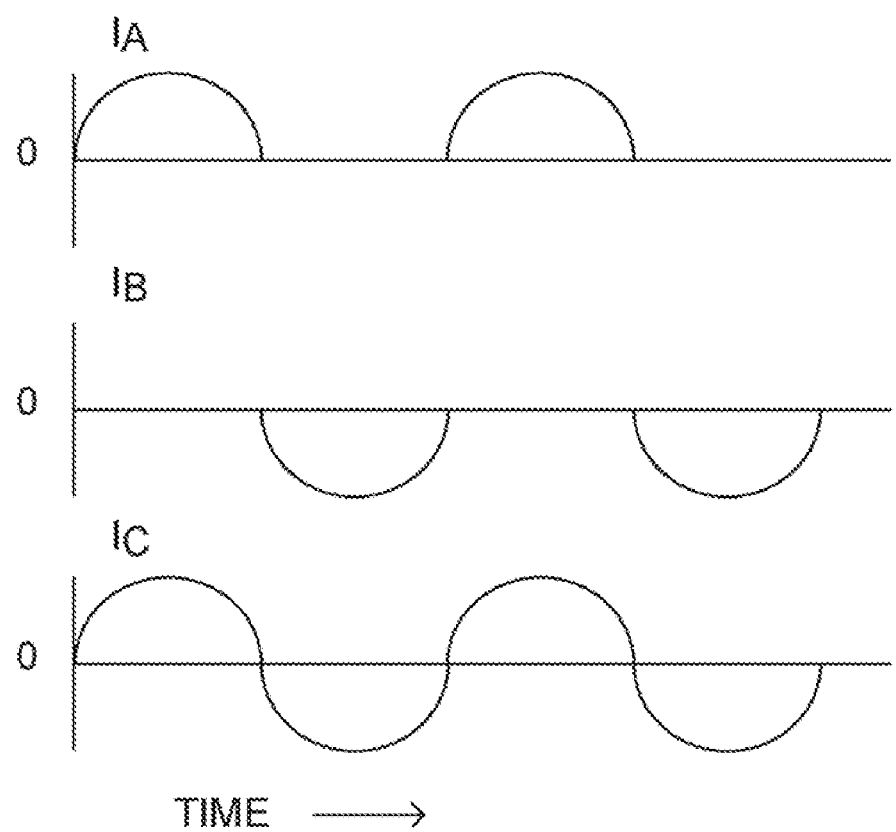
FIG. 2D depicts current in the prior art amplification circuit shown in FIG. 2C.

At some point, hearing aid amplifiers moved to a push-pull circuit designed to drive three-terminal receivers as shown in FIG. 2C. In such circuits, the receiver coil is alternatively energized by Q101 and Q102, producing alternatively the current IA in the collector of Q101 and IB in the collector of Q102. These currents are plotted in FIG. 2D for a sine wave output. Since each half of the receiver coil has the same number of turns and is alternately energized, the result is equivalent to a continuous sine wave current IC in either coil. The circuit of FIG. 2C exhibited higher quiescent current and used a more expensive receiver, but the amplifiers had fewer production issues than the Marschinke circuit. In addition to the typically higher idling current, the Class B circuit of FIG. 2C is less efficient than a circuit using a two-terminal receiver. This comes about because only one half of the receiver coil is energized in each signal swing. Each half of the receiver coil must of necessity take up only half of the available space for the receiver coil. The result is that the DC resistance of each active half coil must be twice the resistance of a simple coil having the same number of turns filling the available space.

The importance to efficiency of minimizing coil resistance is understandable when the receiver is to be used in a Class D application such as those described in U.S. Pat. Nos. 4,592, 087 and 4,689,819, both entitled "Class D Hearing Aid Amplifier," and both issued to Killion. Such applications have a theoretical 100% efficiency. The principle component of idling current in a Class D hearing aid application is the current flowing through the coil resistance at the switching frequency. As the ratio of coil resistance to inductive reactance increases the efficiency steadily drops. In the limit, where the coil resistance dominates entirely, the fall E/R square wave switching current flows in each half cycle of the switching, so the full-signal current and the idling current are identical. In this limiting case, the efficiency drops to that of a Class A amplifier but with much more complicated circuitry.

More details about hearing aid receivers can be found in U.S. Pat. No. 3,588,383, entitled "Miniature Acoustic Transducer of Improved Construction," issued to Carlson et al. and U.S. Pat. No. 3,701,865, entitled "Acoustic Transducer Having Diaphragm Pivoted in its Surround," issued to Carlson et al. Of note, for hearing aid receivers described therein, the electrical impedance goes from the DC resistance of the coil at low frequencies (below approximately 500 Hz) to that of an inductive reactance rising at not quite 6 dB per octave (doubling in reactance for each doubling in frequency).

In Class B applications, an effect of coil resistance is to limit the available output at low frequencies for a given drive voltage. In particular, the total impedance of an efficient hearing aid receiver can be effected by resistance at low frequencies. Thus, the doubled resistance of the active half coil can cause a 6 dB reduction in the available low-frequency output. If the same amount of (half of the available coil) space is devoted to a coil with fewer turns of larger wire, for example 0.707 times the number of turns of wire that is 3 wire sizes larger (0.7 times the Ohms per foot), then the same resistance as a reference full-coil design can be obtained, and the same current will flow through the coil at full output, but the maximum output will have been reduced by 3 dB (the same current in 0.7 times the number of turns will cause 0.7 times the output). This is an improvement over the double-resistance loss of 6 dB, but it is still a loss of 3 dB in output for the same power from the Class B amplifier. In order to recover the same sound output available from a full-coil design, the number of turns must be dropped to 0.5 times and the wire size increased by 6 wire sizes, resulting in a coil of half the resistance. With this coil, the current for a given voltage will be twice the reference full-coil design, but the output (Current× turns=magnimotive force=2×current×0.5 times turns) will be the same. In order to obtain the same performance, twice the idling current and twice the output current must be applied. Thus, we reach the conclusion that a half-coil-active Class B amplifier design as shown in FIG. 2C is only half as efficient at low frequencies, where hearing aid receivers are used.

The type of Class B amplifier shown in FIG. 2C became standard in high-power hearing aids for some three decades or more. However, the circuits shown in FIGS. 2A and 2C both suffer from, among other things, lack of stability, lack of efficiency, or both. After analyzing previous circuit designs and discovering problems that may have prevented such circuits from providing satisfactory performance, the design of a new circuit was undertaken.

Figure 3:
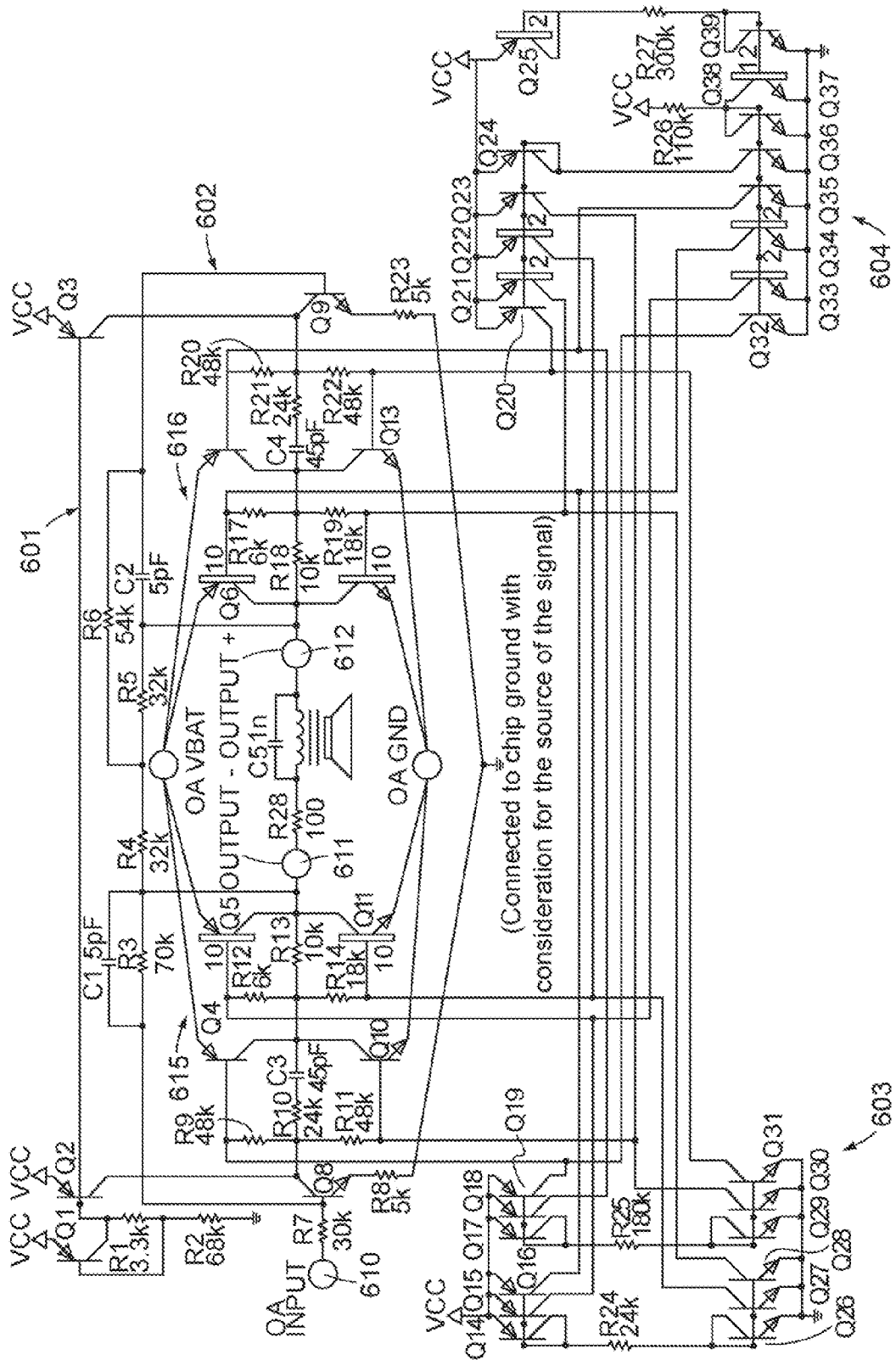
FIG. 3 is a diagram depicting an amplification circuit in accordance with an embodiment of the present technology.

FIG. 3 is a diagram depicting an amplification circuit 601 in accordance with an embodiment of the present technology. In the embodiment shown in FIG. 3, for example, the Base resistors R9 and R10 in the push-pull stages are split in two, which allows a center point for feedback and driving. The two resistors in series R9 and R10 perform a similar function as the resistor 33 of the Marschinke circuit shown in FIG. 2A. However, rather than rely on the voltage drop that occurs when Base current flows, the sub circuits 603, 604 force DC currents in the Base resistors R9 and R10 to create voltage drops. This current never enters the bases, it is withdrawn at the other end of the resistor, thereby biasing the push-pull transistors Q4 and Q10 in a manner that compensates for known variables. Similarly, sub circuits 603 and 604 provide currents to resistors R12 and R14 to bias push-pull transistors Q5 and Q11 in sub circuit 615, and the corresponding resistors and transistors in sub circuit 616.

When the battery is fresh and in the vicinity of about 1.35 Volts, the biasing current creates a voltage drop acting to maintain the intended idling currents through the transistors Q4 and Q10. This is accomplished by sub circuit 603. When the battery drops as low as about 1 Volt, the transistors Q4 and Q10 would otherwise be turned nearly completely off, except that a bias current in the opposite direction forces a reversed voltage drop and again maintains the intended idling currents. This is accomplished by sub circuit 604, which acts to maintain bias in transistors Q5 and Q11 in sub circuit 615 and the corresponding transistors in sub circuit 616. In certain embodiments, for example, when the battery is around about 1.2 Volts the two sub circuits 603, 604 effectively cancel each other out.

Note that the diode-connected transistors Q14 and Q26 in the sub circuit 603 can determine the magnitude of the bias reducing current in resistors R12 and R14, as well as R9 and R11 in sub circuit 615 and the corresponding resistors in sub circuit 616. As the battery voltage increases, this turn-off current also increases. Also, when VBE is running small and/or beta is running high, the push-pull transistors tend to bias harder, and the sub circuit 603 can also run harder and approximately compensate.

The sub circuit 604 begins with R26 creating a reference current in Q36. This current mirror can be active even as the battery drops well below 1 Volt. The action then is to provide, through the mirrors, current that will bias up the push-pull stages. However, the reference current in R26 can be proportionally stolen as the battery voltage increases to the point where the two diode-connected transistors Q25 and Q39 can turn on.

In other words, in the embodiment shown in FIG. 3, for example, circuit 601 includes current mirrors that reflect Base-Emitter voltages of bias transistors in sub circuits 603 and 604 in order to provide VBE bias voltages to driver transistors Q4 and Q10 and output transistors Q5 and Q11 in sub section 615 to provide a Class B output voltage at terminal 611. Likewise, driver transistors Q7 and Q13 and output transistors Q6 and Q12 in sub section 616 provide a Class B output voltage at terminal 612.

Sub section 615 with feedback resistors R3 and R7 can provide 2:1 gain between input 610 and output 611. Sub section 616 with feedback resistors R4, R5, and R6 can provide the complementary output, i.e. provide an output at 612 that is 180 degrees out of phase but otherwise matching the output at 611. In certain embodiments, for example, both can provide a low output impedance of less than about 50 Ohms.

Because the Base-Emitter voltages VBE of the transistor in the sub circuits 603 and 604 all have the same temperature coefficient as each other, e.g. about −2.2 mV per degree C. in certain embodiments, and are on the same die and thus at a nearly identical temperature as the transistors in amplifier sub circuit 602, an operation relatively independent of temperature can be obtained. The operation can be obtained in a manner known in the bipolar circuit art (and illustrated in design of the circuitry used in K-AMP® hearing aids, as described, for example, in U.S. Pat. Nos. 4,170,720 and 5,131,046, which are incorporated herein by reference in their entirety).

For battery voltages above a certain voltage, the sub circuit 603 can provide a compensatory voltage drop across resistors R9 and R11, and across R12 and R14, increasing in close approximation to the increase in battery voltage so that the VBE of transistors Q4 and Q10 and Q5 and Q11, which drive output 611, will be relatively independent of supply voltage above that certain voltage. Similarly, the VBE voltages of transistors Q7 and Q13 and Q6 and Q12 in the sub section driving output 612 can similarly be relatively independent of battery voltage.

In sub circuit 603, resistor R24 and diode-connected transistors Q14 and Q26 can provide increasing current to transistors Q15 and Q27 and they in turn to resistors R12 and R14 as the supply voltage increases, in order to maintain a nearly constant VBE bias voltage on transistors Q5 and Q11 as the supply voltage increases above a certain level. The other transistors in the sub circuit 603 can similarly provide a nearly constant VBE bias voltage, as the supply voltage increases above a certain level, for transistors Q4, Q10, Q6, Q12, Q7, and Q13 in sub circuits 615 and 616. The use of a higher value for R25, which can bias diode connected transistors Q17 and Q29, than for R24 can compensate for the higher value of resistors in the sub circuit of the driver transistors Q4, Q10, Q7, and Q13.

One feature of the circuit 601 is that for battery voltages below a certain voltage, the sub circuit 604 can provide a compensating voltage drop across the above named resistors in sub section 615 and 616 operating to reverse the voltage drop across resistors R9 and R11 and across R12 and R14 in sub section 615 and their corresponding resistors in sub section 616. In particular, the sub circuit 604 can maintain the VBEs and thus the idling currents in the two sections at normal operating values even when the supply voltage drops below the sum of the corresponding operating VBEs of Q4 plus Q10, etc.

To further explain, the operation of bias transistors Q20-Q23 and Q32-Q35 is to provide current through the aforementioned resistors R9, R11, R12 and R14 in sub circuit 615 (and the corresponding resistors in sub circuit 616) flowing from the positive supply through first resistor R11 and then R9, for example, to the negative rail (chip ground). This current is arranged to increase as the supply voltage decreases, providing the Base-Emitter bias voltage required for proper operation even when the supply voltage falls below the sum of the Base-Emitter voltages. In certain embodiments, it has been found adequate to increase the size of the bias transistors feeding the output stage transistors in order to provide the required compensating bias voltage as the supply drops below a certain voltage.

In order to avoid conflict between operation of sub circuits 603 and 604, the operation of resistor R27 with transistors Q25, Q39, and Q38 in sub circuit 604 is to disable the operation of sub circuit 604 above a certain supply voltage by effectively removing the collector voltage from bias transistor Q37 so that sub circuit 604 does not affect the functioning of circuit 601 above a certain supply voltage.

In certain embodiments, for example, the circuit 601 can provide a relatively low-cost, low-distortion, high-efficiency amplifier suitable for use with two-terminal receivers in hearing aids and other low-voltage applications. Further, in certain embodiments, for example, the circuit 601 can provide an integrated circuit Class B output drive that can operate with low idling current and low distortion that is almost independent of temperature and supply voltage over the range of about 1.0 to about 1.4 Volts. In certain embodiments, for example, the circuit 601 can be used in a hearing aid and can provide a battery life that is 3-10 times that available from many existing digital hearing aids.

As described below, certain embodiments of the present technology provide hearing aids that include the circuit 601 described above. In other embodiments, for example, the circuit described above can be used in connection with other devices, as will be appreciated by those skilled in the art after reviewing this disclosure.

Figure 4:
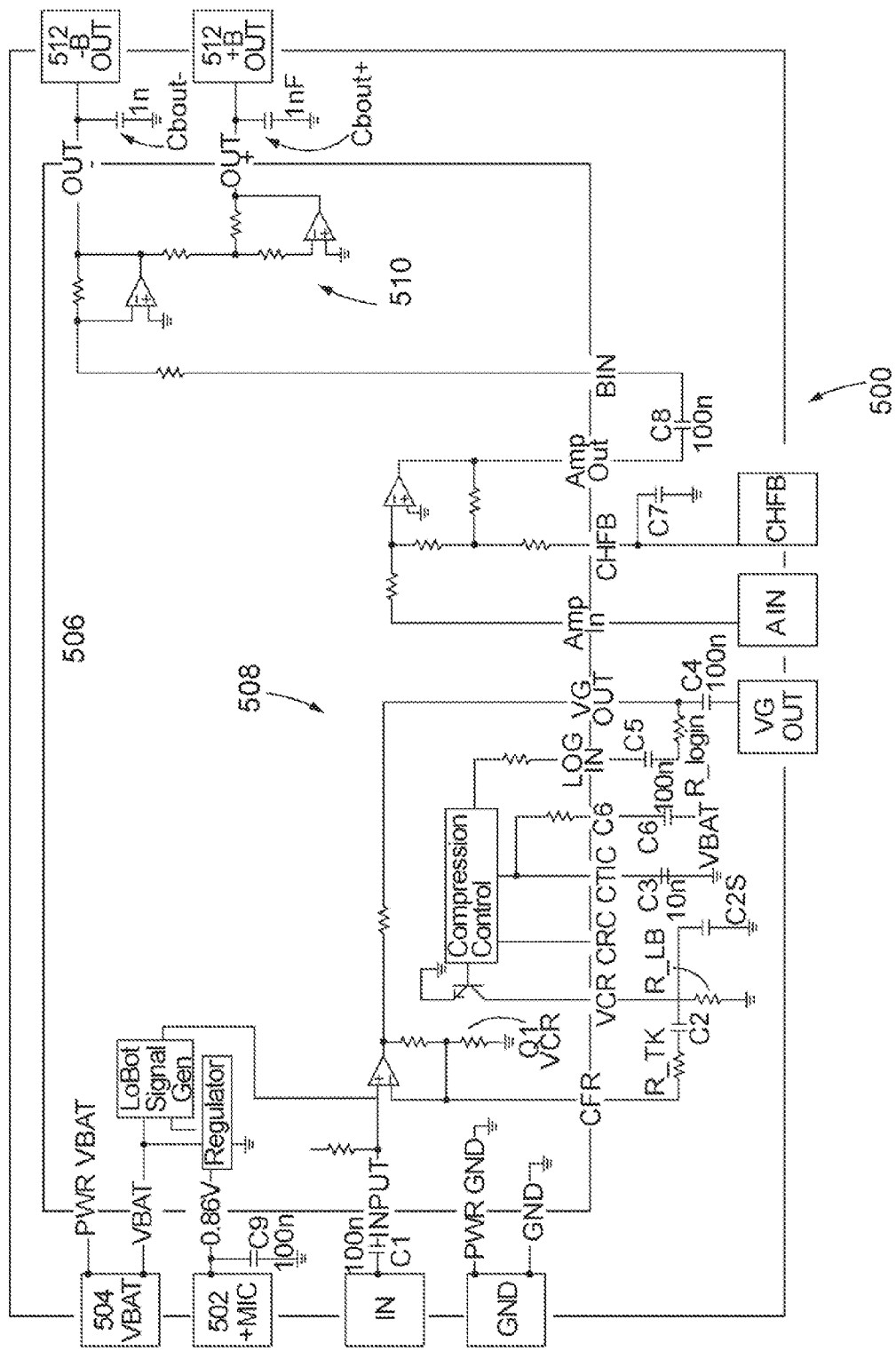
FIG. 4 is a diagram depicting hearing aid components and circuitry used in accordance with an embodiment of the present technology.

FIG. 4 is a diagram 500 depicting circuitry and components of a hearing aid. The components include a microphone 502, a battery 504, and an amplification circuit 506. The microphone 502 is shown connected to the regulated supply, but it will be readily understood that such microphones have an output terminal that is connected to the IN terminal of the circuit 508 of FIG. 4, and a ground terminal that is connected to the GND terminal of circuit 508. The amplification circuit 506 includes circuitry 508 and circuitry 510. Circuitry 508 can include the elements shown, which elements are described in further detail in U.S. Pat. No. 5,131,046, entitled "High Fidelity Hearing Aid Amplifier," which issued to Killion et al. and is incorporated herein by reference in its entirety. Such circuitry is that which is used in K-AMP® hearing aids described previously. Circuitry 510 can include the circuit 601 described above in connection with FIG. 3. Such a configuration was previously unavailable because no suitable Class B output circuit was available to operate properly in combination with the circuitry used in K-AMP® hearing aids in order to provide long battery life. Further, in certain embodiments, circuitry 508 and circuitry 510 can be implemented as an integrated circuit.

In the embodiment shown in FIG. 4, for example, the battery 504 can provide power for a hearing aid. The microphone 502 can receive ambient sound and convert the sound into electrical signals. The electrical signals can be communicated to the amplification circuit 506. The amplification circuit 506 can be configured to process received signals in many ways, some of which are described below. The amplification circuit 506 can communicate processed signals to a two-terminal receiver via outputs 512. The receiver can convert the processed signals into sound and communicate the sound to a user of the hearing aid.

The embodiment shown in FIG. 4, for example, provides an analog hearing aid with Class B amplifier that can provide the sound quality of K-AMP® hearing aids without the cost associated with Class D amplifiers. In certain embodiments, for example, the hearing aid can provide frequency response accuracy of at least about 80 percent. The shown embodiment can also reduce costs by eliminating the need for a three-wire receiver traditionally used in connection with Class B hearing aid circuits. Further, in certain embodiments, the low idling current associated with the Class B amplifier can provide for extended battery life. In certain embodiments, for example, the hearing aid can provide for battery drain of less than about 0.5 mA.

In certain embodiments, for example, with a 312 zinc air cell, a battery life of three weeks can be provided. In certain embodiments, for example, with a 13A zinc air cell, a battery life of 5 weeks can be provided. This is in sharp contrast to the 3 days to 10 days battery life typical for many digital hearing aids.

Figure 5A:
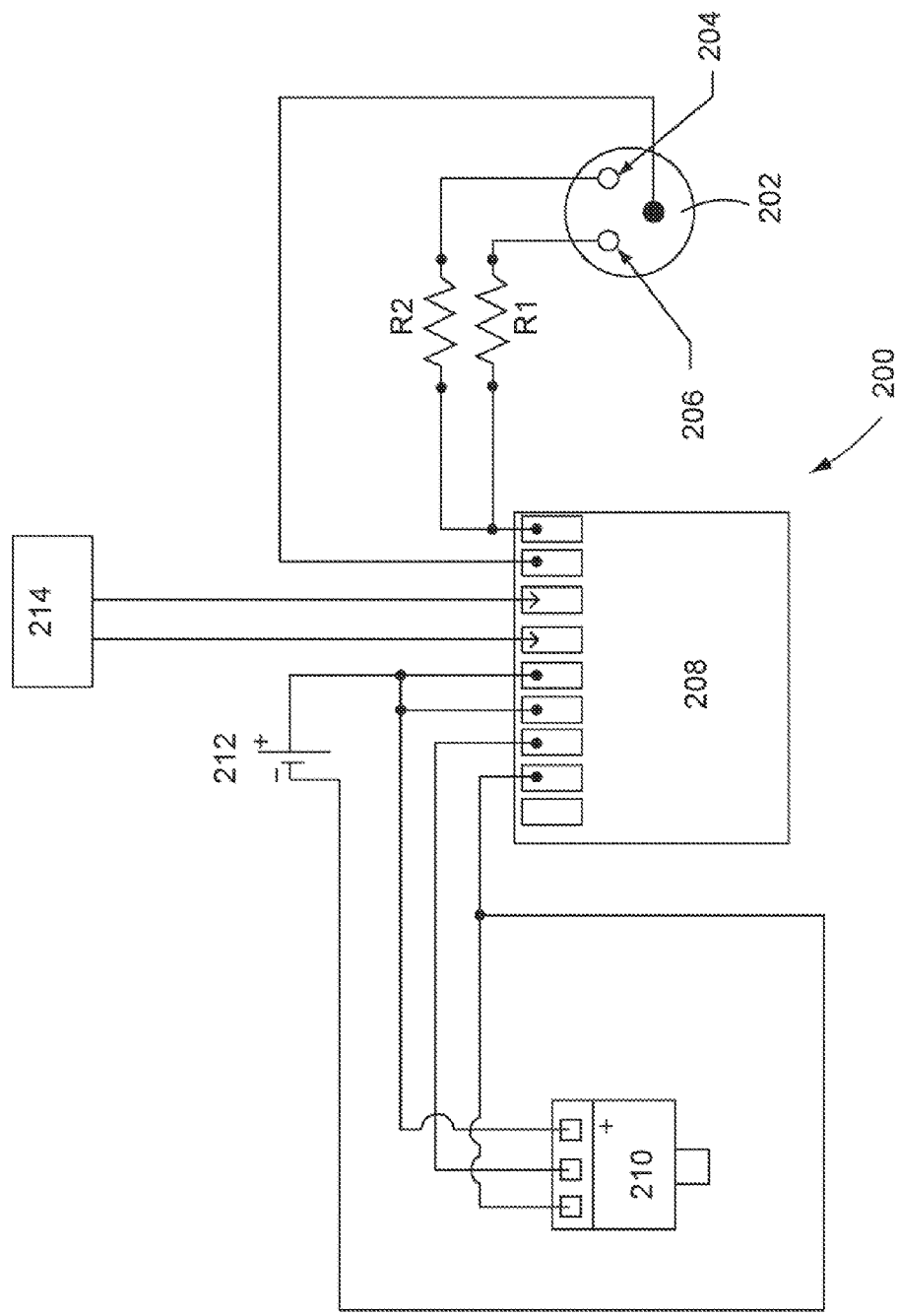
FIG. 5A is a diagram depicting hearing aid components used in accordance with an embodiment of the present technology.

FIG. 5A is a diagram depicting hearing aid components 200 used in accordance with an embodiment of the present technology. The components 200 include switch 202, amplification circuit 208, microphone 210, battery 212 and receiver 214. Battery 212 provides power. Microphone 210 converts sound to electrical signals and communicates the signals to the amplification circuit 208. Amplification circuit 208 can process the signals. In certain embodiments, for example, the amplification circuit 208 can be configured in the same manner as the amplification circuit 506 described in connection with FIG. 4. Amplification circuit 208 can communicate the processed signals to the receiver 214, which can convert the signals to sound. Switch 202 includes a first setting 204 configured to provide high gain and a second setting 206 configured to provide low gain. Switch 202 is in communication with amplification circuit 208 via resistors R1 and R2. In certain embodiments, for example, a low gain setting can provide about 15 db of high-frequency insertion gain (real-ear gain) for quiet sounds and about 0 dB insertion gain for loud sounds, which are passed through as if the hearing aid was not there. In certain embodiments, for example, a high gain setting can provide about 23 db of high-frequency insertion gain (real-ear gain) for quiet sounds and about 8 dB insertion gain for loud sounds. In such embodiments, for example, quiet sounds can be sounds below about 50-60 dB and loud sounds can be sounds above about 85-90 dB. In certain embodiments, for example, quiet and loud sounds can be specified at other levels. In certain embodiments, for example, sounds between the quiet sound ceiling and the loud sound floor can receive proportional amplification, wherein every 2 dB increase of input sound results in a 1 dB increase in amplification. In certain embodiments, for example, sounds between the quiet sound ceiling and the loud sound floor can receive proportional amplification at other levels.

Figure 5B:
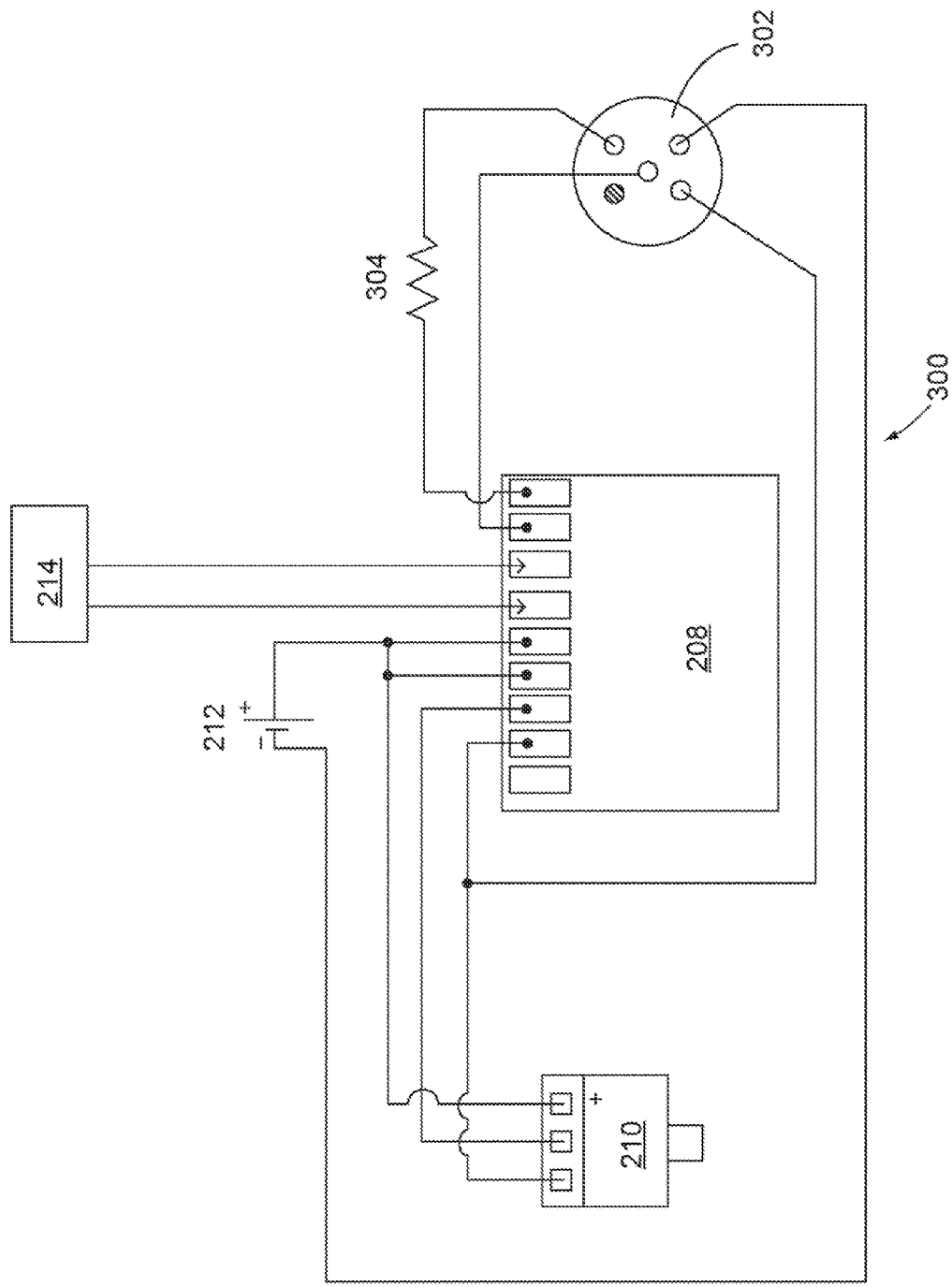
FIG. 5B is a diagram depicting hearing aid components used in accordance with an embodiment of the present technology.

FIG. 5B is a diagram depicting hearing aid components 300 used in accordance with an embodiment of the present technology. The components 300 include volume controller 302, amplification circuit 208, microphone 210, battery 212 and receiver 214. Battery 212 provides power. Microphone 210 converts sound to electrical signals and communicates the signals to the amplification circuit 208. Amplification circuit 208 can process the signals. In certain embodiments, for example, the amplification circuit 208 can be configured in the same manner as the amplification circuit 506 described in connection with FIG. 4. Amplification circuit 208 can communicate the processed signals to the receiver 214, which can convert the signals to sound. Volume controller 302 can provide for increasing and decreasing the volume of sound provided by the receiver 214. Volume controller 302 is in communication with amplification circuit 208 via resistor 304. In certain embodiments, for example, by suitable choice of the value of resistance in volume controller 302 and the resistance of resistor 304, a range of high-frequency gain for quiet sounds from about 5 dB to about 23 dB can be obtained, with a corresponding range of gain for loud sounds of about −10 dB to about +8 dB. In such embodiments, for example, quiet sounds can be sounds below about 50-60 dB and loud sounds can be sounds above about 85-90 dB. In certain embodiments, for example, quiet and loud sounds can be specified at other levels. In certain embodiments, for example, sounds between the quiet sound ceiling and the loud sound floor can receive proportional amplification, wherein every 2 dB increase of input sound results in a 1 dB increase in amplification. In certain embodiments, for example, sounds between the quiet sound ceiling and the loud sound floor can receive proportional amplification at other levels. The ability to attenuate loud sounds can be useful in some circumstances where the wearer needs hearing protection but because of his or her hearing loss is reluctant to wear it. With the configuration shown in FIG. 5B, for example, it is possible to provide protection from loud sounds while still providing a small amount of high-frequency gain for quiet sounds.

FIG. 6A is a top view of a hearing aid 400 used in accordance with an embodiment of the present technology. FIGS. 6B and 6C are side views of the hearing aid 400 depicted in FIG. 6A. FIG. 6D is a side sectional view of the hearing aid 400 about the line A-A of FIG. 6B. FIG. 6E is a side view of the hearing aid 400 depicted in FIG. 6A with an ear tip 406 attached thereto. The hearing aid 400 includes a housing 402 comprising a first end 404 configured to receive a removable ear tip 406 (shown in FIG. 6E). The first end 404 includes a sound port 410. When the hearing aid 400 is inserted into a user's ear, the first end 404 is inserted into the user's ear canal such that sound may be communicated to the ear canal from the sound port 410 via the ear tip 406. The housing 400 also includes a second end 408 opposite the first end 404. A handle 412 is disposed on the second end 408. The handle 412 extends from the second end 408 and is configured to facilitate insertion and removal of the hearing aid 400. The second end 408 includes a sound port 414 configured to receive a microphone 416. When the hearing aid 400 is inserted into a user's ear, the second end 408 faces away from the user's ear canal such that ambient sound can be communicated to the microphone 416. The second end 408 also includes a switch 418 movable between a first position and a second position. In certain embodiments, for example, the switch 418 and other components of the hearing aid 400 can be configured as shown and described in FIG. 5A. As shown in FIG. 6D, disposed inside the housing 402 is the microphone 416, wiring 420, 430, resistors 428, battery 422, amplification circuit 426, and receiver 424. Sound received at the microphone 416 is converted to electrical signals that are processed by the amplification circuit 426. The amplification circuit 426 provides processed signals to the receiver 424, which converts the signals into sound. Sound passes from the receiver 424 via sound port 410 and through the ear tip 406 (shown in FIG. 6E). While passing through the ear tip 406, the sound passes through a damper 430 mounted with and disposed within the ear tip 406. In certain embodiments, for example, the damper 430 can be a commercially available damper, such as the ER-4S damper made by Etymotic Research, Inc., for example, and/or a commercial embodiment of the dampers described in U.S. Pat. Nos. 6,666,295 and 6,830,876, issued to Killion et al., the content of which patents is incorporated herein by reference in their entirety. In certain embodiments, for example, the damper 430 can smooth frequency response.

Figure 1B:
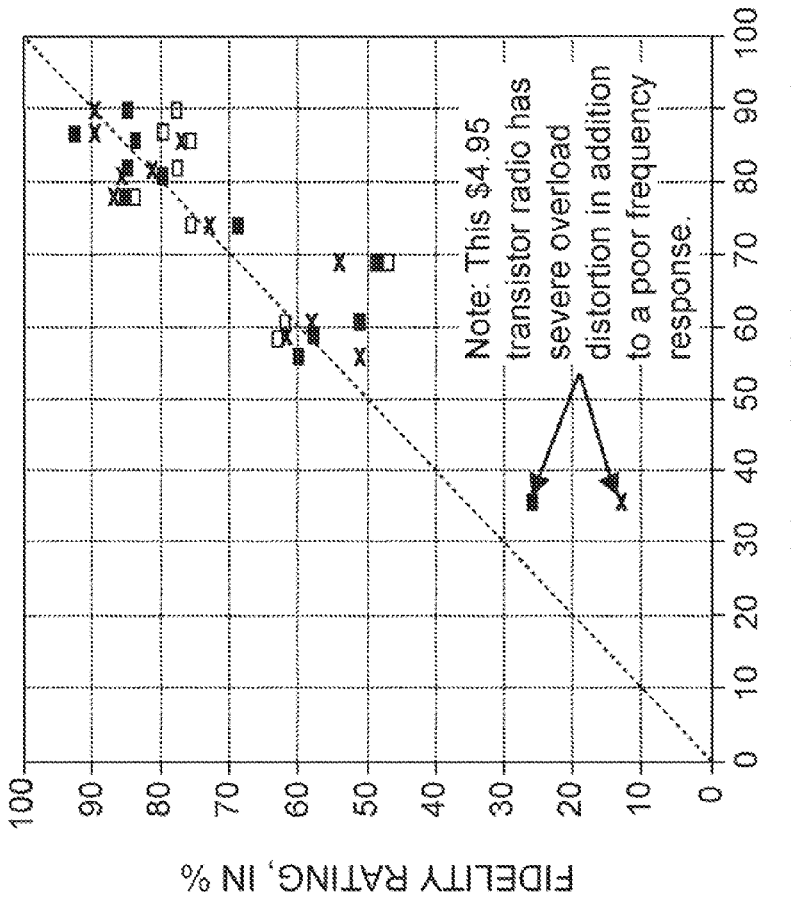
FIG. 1B depicts a graph comparing average fidelity ratings assigned several hearing aids and other sound reproducers compared with a frequency response 25-band Accuracy Score calculated for the same sound reproducers.
Figure 1C:
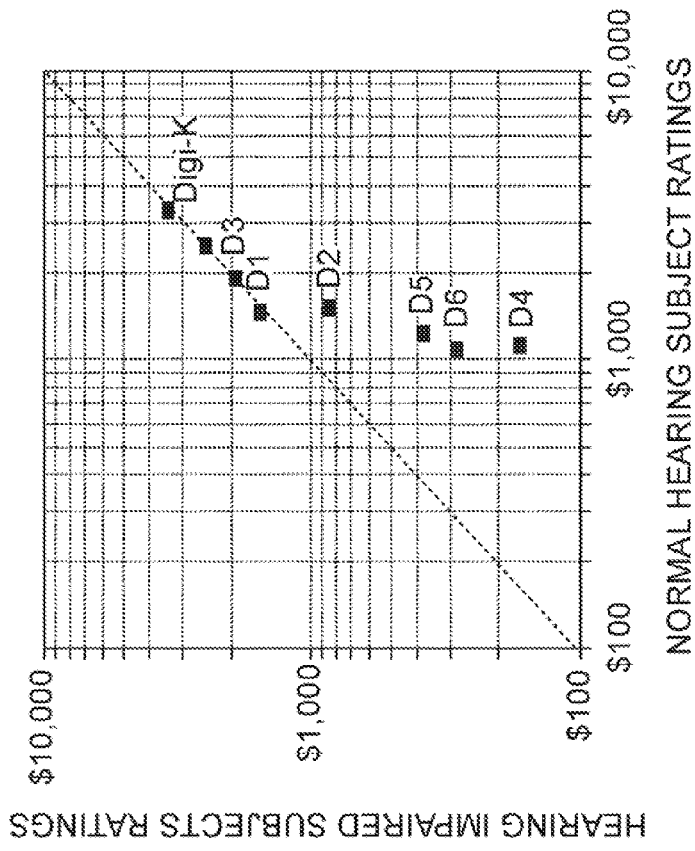
FIG. 1C depicts a graph comparing value ratings of hearing aids by normal hearing individuals and hearing impaired individuals.
Figure 6G:
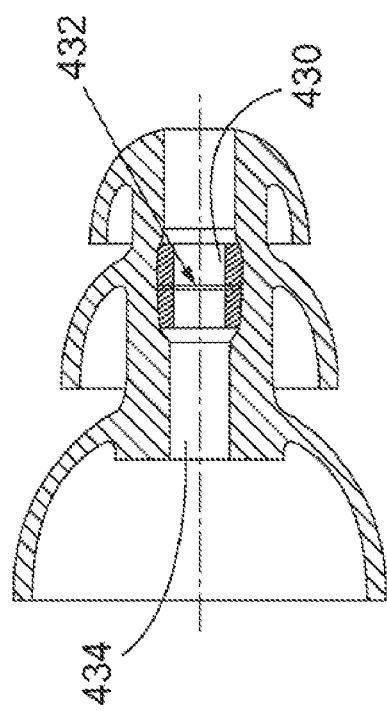
FIG. 6G is a side sectional view of the eartip shown in FIG. 6F.

Applicants have found that it is common to provide hearing aids without smooth frequency response, even in expensive hearing aids, as indicated by the low fidelity illustrated in FIGS. 1A, 1B, and 1C. This despite applicant Killion's description in several publications of a means for providing a high fidelity frequency response by a combination of selected sound channel dimensions forming "acoustical horns" (sometimes informally called "earmold plumbing") and acoustical damping element or elements to smooth the response peaks. See, for example, Killion M C, "Earmold Plumbing for Wideband Hearing Aids," J. Acoust. Soc. Am. 59, 562(A), 1976, available from Knowles Electronics, Franklin Park, Ill., and Killion M C and Tillman T W, "Evaluation of high-fidelity hearing aids," J. Speech Hearing Res. 25, 15-25, 1982. FIG. 6L illustrates the improvement brought about by applying these techniques. In FIG. 6L, taken from the latter reference, the dotted line depicts the frequency response of conventional earmolds, and the solid line depicts the frequency response of earmolds that apply the techniques discussed above. U.S. Pat. Nos. 4,852,683 and 5,113,967, which issued to Killion and Killion et al., respectively, also relate to using damping to smooth frequency response.

Applicant Killion later described electronic means of smoothing the frequency response using "electronic damping" wherein the inverse of a damping peak was programmed into the hearing aid amplifier. See, for example, U.S. Pat. No. 5,812,679, entitled "Electronic Damper Circuit for a Hearing Aid and a Method of Using the Same," issued to Killion et al. and U.S. Pat. Nos. 6,047,075 and 6,466,678, both issued to Killion et al. Here, again, the frequency response of some digital hearing aids suggest that neither method is being used.

In order to provide a low-cost high-fidelity hearing aid, electronic damping may be considered impractical due to the associated cost. However, applicants have found that replaceable dampers, such as the ER-4S dampers made by Etymotic Research, Inc., for example, can be used in hearing aids and are relatively cheaper.

Applicants have also found that a problem exists, wherein sublimated earwax in some wearers can clog the pores of a damping element. In some cases, a dispenser may simply remove the damper or send the hearing aid in for repair. As discussed below, certain embodiments of the present technology provide hearing aids with replaceable dampers that are configured to block debris from entering a hearing aid.

Figure 6F:
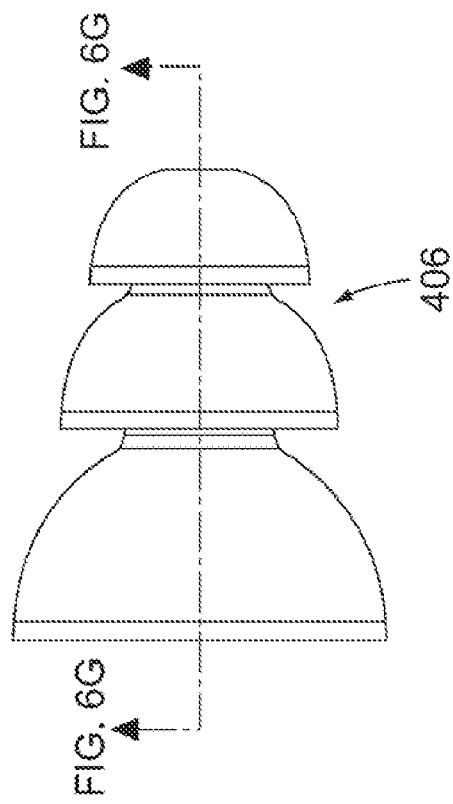
FIG. 6F is a side view of an eartip used in accordance with an embodiment of the present technology.

FIG. 6F is a side view of an ear tip 406 used in accordance with an embodiment of the present technology. FIG. 6G is a side sectional view of the ear tip 406 shown in FIG. 6F about the line A-A. As shown, the ear tip 406 includes a plurality of flanges. The ear tip 406 also includes a damper 432 mounted with the ear tip 406 and disposed within the sound path 434 of the ear tip 406. The damper 430 includes a mesh filter 432 that can provide a debris barrier. For example, the filter 432 can block ear wax and/or other debris form entering a hearing aid through the ear tip 406.

Figure 6I:
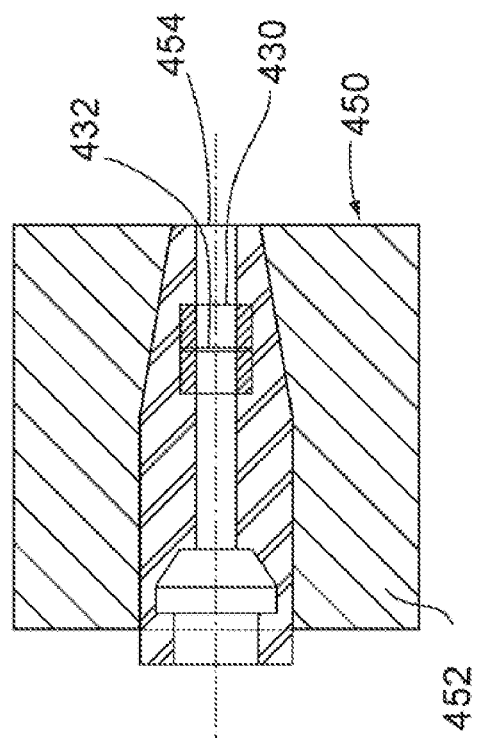
FIG. 6I is a side sectional view of the eartip shown in FIG. 6H.
Figure 6H:
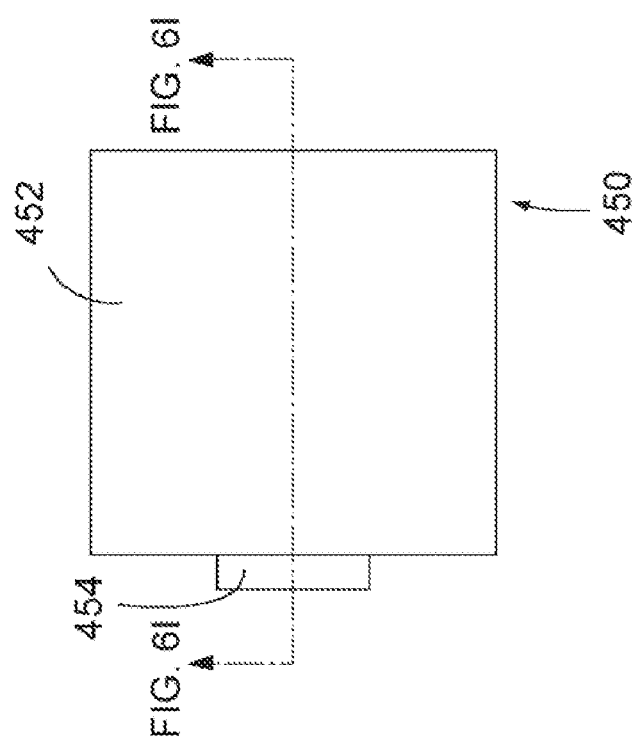
FIG. 6H is a side view of an eartip used in accordance with an embodiment of the present technology.
Figure 6L:
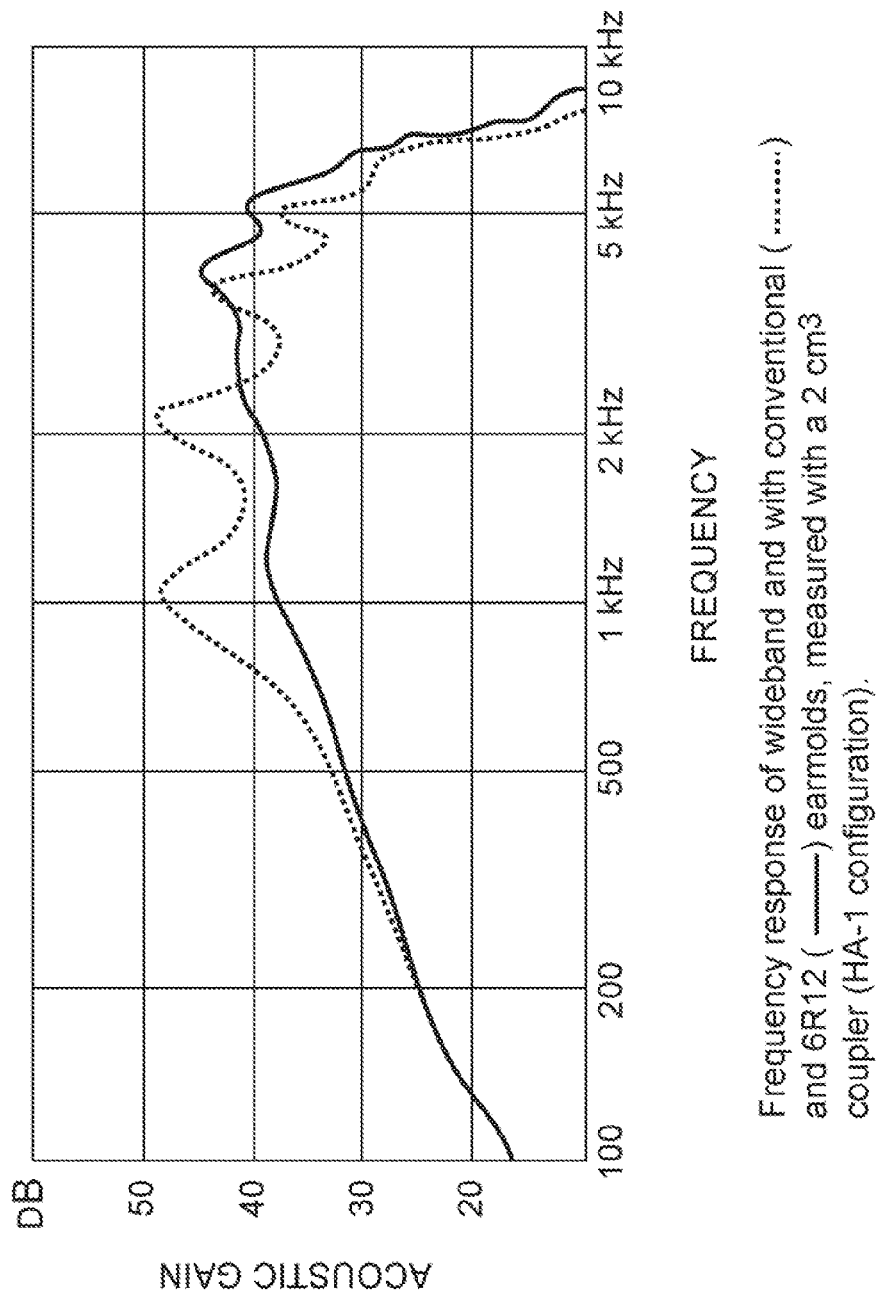
FIG. 6L is a graph comparing results of frequency response experiments.

FIG. 6H is a side view of an ear tip 450 used in accordance with an embodiment of the present technology. FIG. 6I is a side sectional view of the ear tip 450 shown in FIG. 6H about the line A-A. As shown, the ear tip 450 comprises an ear plug 452 with a sound path 454 therethrough. The ear tip 450 also includes a damper 432 mounted with the ear tip 450 and disposed within the sound path 454 of the ear tip 450. The damper 430 includes a mesh filter 432 that can provide a debris barrier. For example, the filter 432 can block ear wax and/or other debris form entering a hearing aid through the ear tip 450.

FIG. 6J is a side view of a hearing aid 460 used in accordance with an embodiment of the present technology. FIG. 6K is a side sectional view of the hearing aid 460 shown in FIG. 6J. The hearing aid 460 is the same as the hearing aid 400 described previously except that the hearing aid 460 includes the damper 430 mounted with and disposed within the housing 402 rather than mounted with and disposed within the ear tip. Likewise, the hearing aid 460 can be used with an ear tip 462 that does not include a damper disposed therein.

FIG. 7A is top view of a hearing aid 700 used in accordance with an embodiment of the present technology. FIGS. 7B and 7C are side views of the hearing aid 700 depicted in FIG. 7A. FIG. 7D is a side sectional view of the hearing aid 700 about the line A-A of FIG. 7B. FIG. 7E is a side view of the hearing aid 400 depicted in FIG. 6A with an ear tip 406 attached thereto. FIGS. 7A-7E depict a hearing aid 700 with many of the same elements as the hearing aid 400 shown and described in connection with FIGS. 6A-6E. However, the hearing aid 700 includes a volume controller 702 rather than a switch 418. In certain embodiments, for example, the volume controller 702 and other components of the hearing aid 700 can be configured as shown and described in FIG. 5B.

FIG. 7F is a side view of a hearing aid 760 used in accordance with an embodiment of the present technology. FIG. 7G is a side sectional view of the hearing aid 760 shown in FIG. 6J. The hearing aid 760 is the same as the hearing aid 700 described above except that the hearing aid 760 includes the damper 430 mounted with and disposed within the housing 402 rather than mounted with and disposed within the ear tip. Likewise, the hearing aid 460 can be used with an ear tip 462 that does not include a damper disposed therein.

Figure 8A:
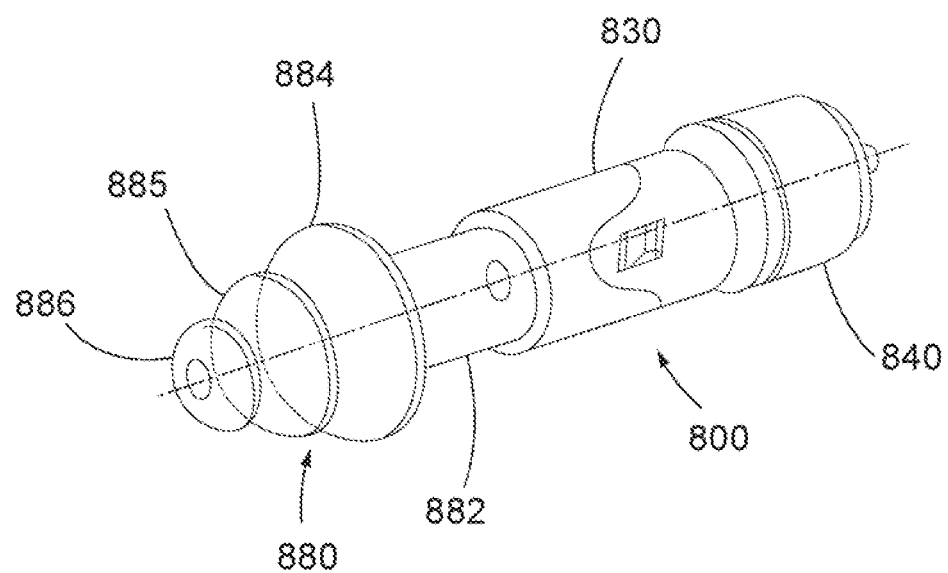
FIG. 8A illustrates a one-size-fits-most hearing aid in accordance with an embodiment of the present technology.
Figure 8B:
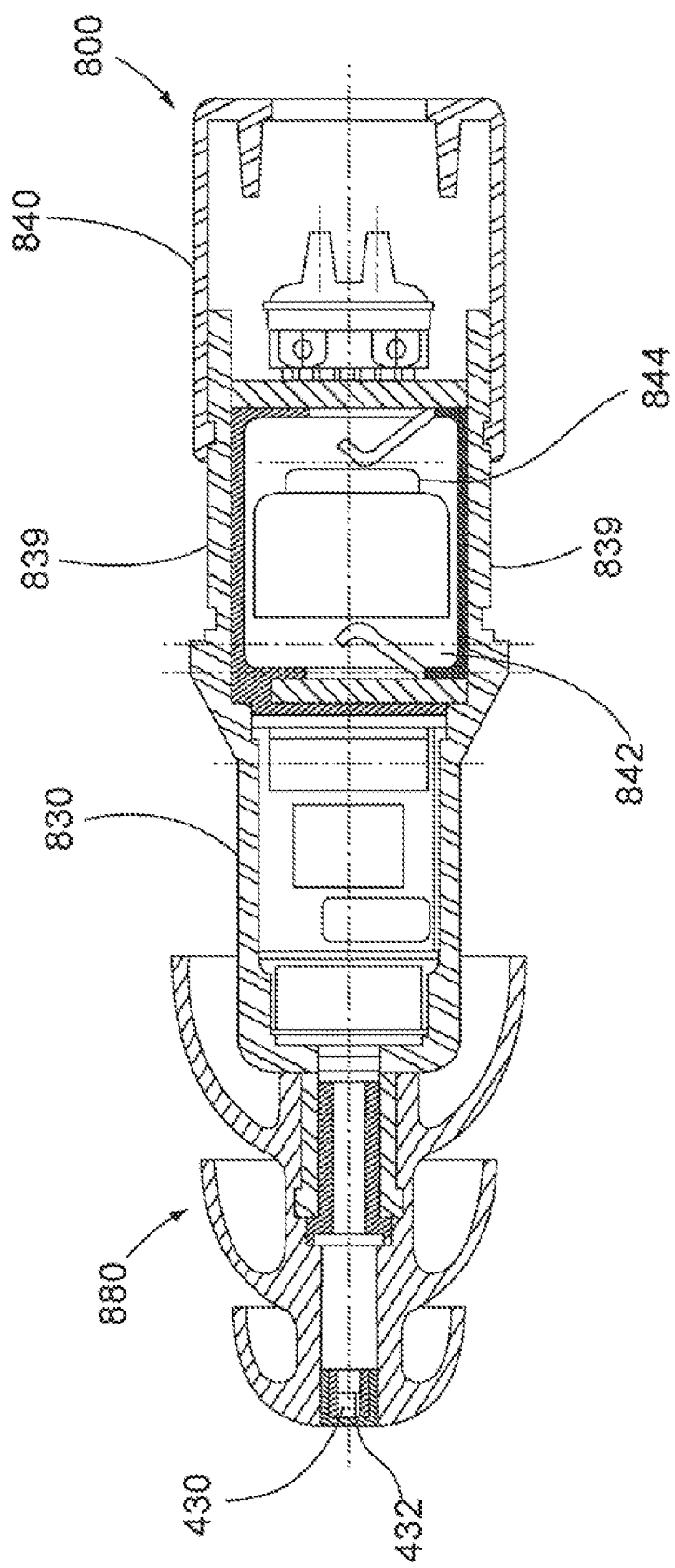
FIG. 8B illustrates a side view of the hearing aid of FIG. 8A with the battery sleeve retracted.

FIG. 8A illustrates a one-size-fits-most hearing aid 800, in accordance with an embodiment of the present technology. FIG. 8B illustrates a side view of the hearing aid 800 of FIG. 8A with the battery sleeve 840 retracted. In certain embodiments, for example, the hearing aid 800 can include similar elements and similar functionality as the hearing aids described in U.S. patent application Ser. No. 11/031,915, filed Jan. 7, 2005 and published as 2005/0147267, which patent application is hereby incorporated herein by reference in its entirety.

In an embodiment, the hearing aid 800 may comprise a triple-flange eartip 880 attached to a cylindrical housing 830 containing a replaceable battery, a microphone, an amplifier, a receiver to reproduce the amplified sound, and a switch. In certain embodiments, the amplifier can include an amplification circuit like the amplification circuits 506, 208, 426 described above. Other hearing aid components, such as the microphone, battery and receiver, for example, can also be configured like the components described above. In certain embodiments, for example, the eartip 880 can include a damper 430 with filter 432 as described above. In such embodiments, the damper 430 can be replaced by replacing the eartip 880. In certain embodiments, for example, a damper 430 with filter 432 can be mounted with and disposed in the housing 830 such that the damper 430 can be removed and replaced by simply removing an eartip.

In the embodiment shown in FIGS. 8A and 8B, for example, hearing aid 800 has a generally cylindrical shape. A battery sleeve 840 and main body or housing 830 are also be cylindrical. The battery sleeve 840 may be closed as in 8B, and in such an embodiment the hearing aid 800 may be worn by the user. When, for example, the user may want to replace the battery 844, the battery sleeve 840 may be retracted, and the battery slot 842 may be exposed and the battery 844 may be removed and replaced. The battery slot 842 may be defined by the sides 839, which may be attached to the hearing aid main body or housing 830. In certain embodiments, an old battery 844 need not be removed, instead a new battery may replace the old battery by simply inserting the new battery into the battery slot in any of the four possible positions, and doing so forces the old battery to be disposed of automatically from the other side.

In the embodiment shown in FIGS. 8A and 8B, for example, eartip 880 may have rotational symmetry around its axis and the axis of the hearing aid 800. In particular, eartip flanges 884, 885, and 886 and eartip stem 882 may all be generally round. The use of the three eartip flanges 884, 885, and 886 may increase the percentage of persons who can obtain a good comfortable seal in the ear canal. The eartip flanges 884, 885, and 886 are in a decreasing size, whereas the smallest flange 886 is closest to the tip of the hearing aid 800, and the largest flange 884 is farthest away from the tip of the hearing aid 800. Consequentially, if the smallest flange 884 does not seal the ear canal well, the slightly larger flange 885 may do so, and if the flange 885 also does not completely seal the ear canal, the largest flange 886 may do so, thus ensuring a comfortable and good seal of the ear canal for a larger number of users than if one flange were used. Ensuring a good seal to the ear canal for a hearing aid generally provides a good performance, because, for example, it prevents unwanted audio feedback of sounds, which may interfere with the sounds coming into the hearing aid.

Figure 9A:
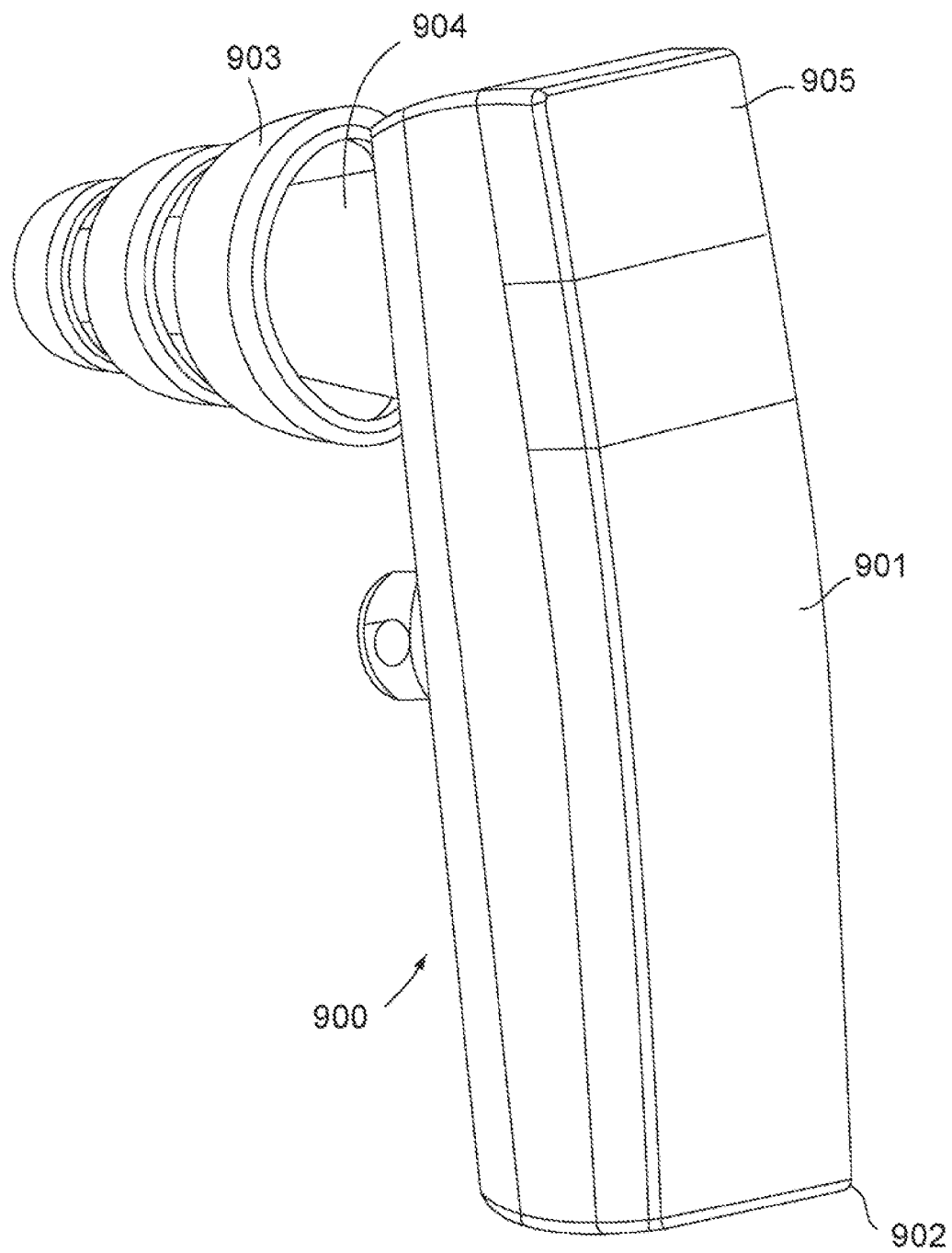
FIG. 9A illustrates a perspective view of a hearing aid used in accordance with an embodiment of the present technology.
Figure 9B:
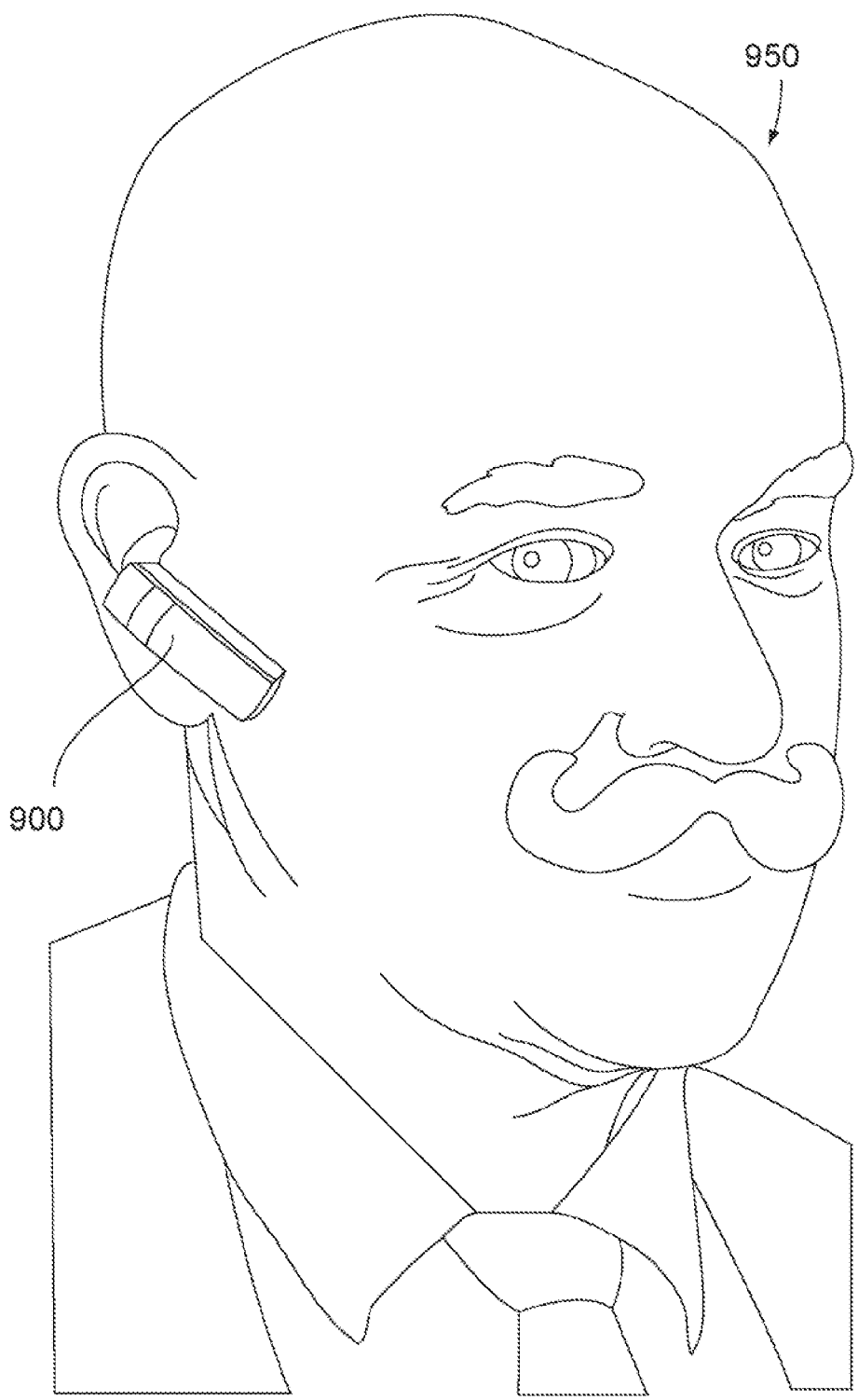
FIG. 9B depicts the hearing aid of FIG. 9A in an operative position on a user.
Figure 9C:
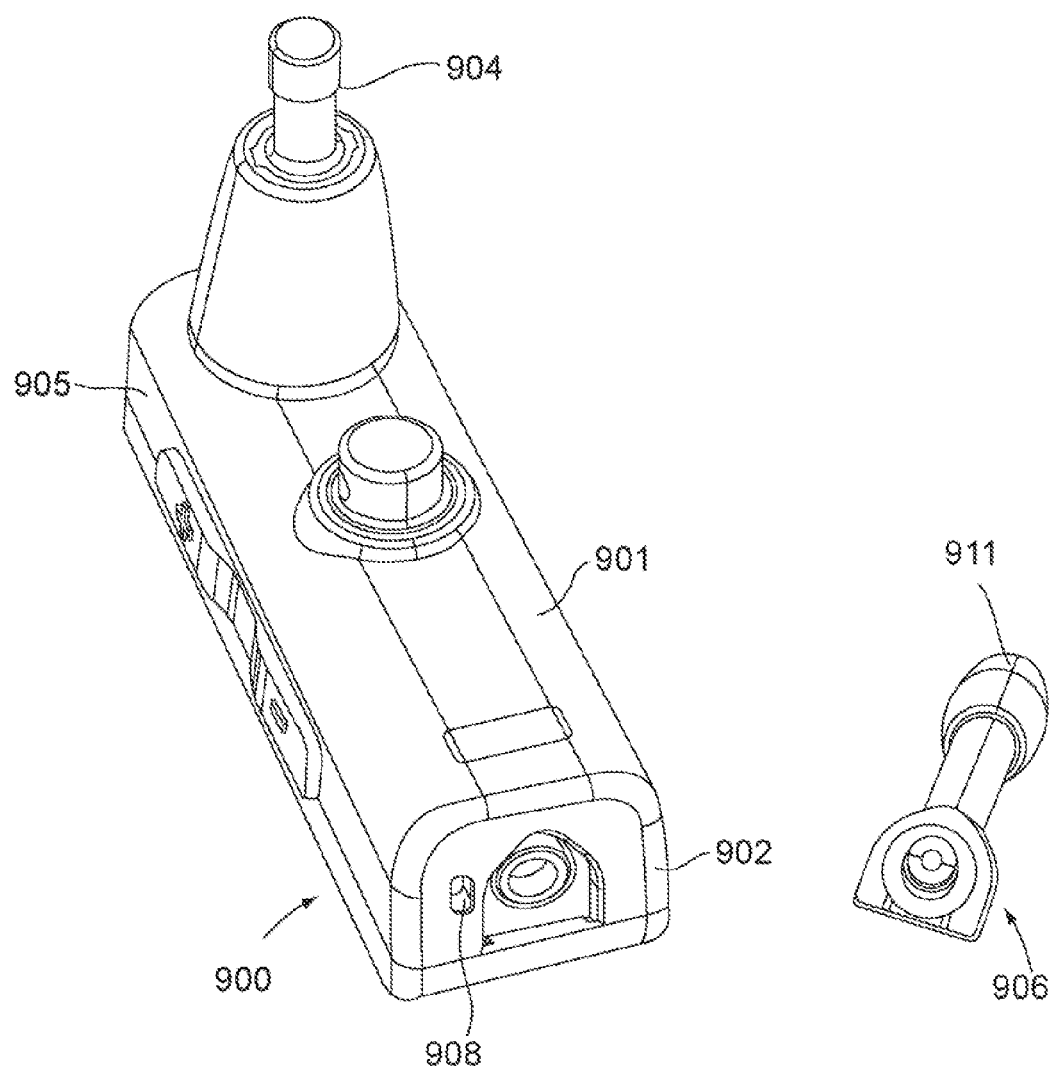
FIG. 9C depicts the hearing aid of FIG. 9A and a boom/microphone assembly that can be used therewith in accordance with an embodiment of the present technology.

FIG. 9A illustrates a perspective view of a hearing aid 900 used in accordance with an embodiment of the present technology. FIG. 9B depicts the hearing aid 900 of FIG. 9A in an operative position on a user 950. FIG. 9C depicts the hearing aid 900 of FIG. 9A and a boom/microphone assembly 906 that can be used therewith in accordance with an embodiment of the present technology. To some users, the hearing aid 900 with or without the boom/microphone assembly 906 may be considered more aesthetically pleasing than other designs.

In the embodiment shown in FIG. 9A, the hearing aid 900 includes a housing 901 comprising a first end 905 with a port 904 extending therefrom. The port 904 is configured to receive a removable eartip 903. When the hearing aid 900 is inserted into a user's ear, the eartip 903 is inserted into the user's ear canal such that sound may be communicated to the ear canal from the hearing aid 900. The housing 901 also includes a second end 902 opposite the first end 905. The second end 902 includes a sound port 908 configured to receive ambient sound. A microphone is disposed in the housing 901 such that it can receive ambient sound via the sound port 908. When the hearing aid 900 is inserted into a user's ear, the second end 902 is outside the ear canal such that ambient sound can be communicated to the microphone.

In certain embodiments, for example, the hearing aid 900 can include a battery, microphone, amplification circuit, and receiver configured like those described above in connection with other embodiments. Further, in certain embodiments, for example, the hearing aid 900 can include a switch or volume controller as described above in connection with other embodiments. The microphone can convert ambient sound into electrical signals that are processed by the amplification circuit, then the receiver can convert the electrical signal into sound. Sound can be passed through port 904, a damper, and eartip 903 and into the ear canal of a user. In certain embodiments, the eartip 903 can provide an acoustic seal of the ear canal. In certain embodiments, for example, the eartip can include a damper 430 with filter 432 as described above. In such embodiments, the damper 430 can be replaced by replacing the eartip. In certain embodiments, for example, a damper 430 with filter 432 can be mounted with and disposed in the port 904 such that the damper 430 can be removed and replaced by simply removing an eartip.

In certain embodiments, such as the embodiment shown in FIG. 9C, for example, the hearing aid 900 can include a directional microphone 911 in a boom/microphone assembly 906 that is attachable to the housing 901. In such embodiments, for example, experiments show that an improvement in signal-to-noise ratio of about 6 dB can be obtained compared to the microphone disposed on the housing 901. Either microphone can receive sound, convert the sound into electrical signals.

In certain embodiments, for example, providing a hearing aid 900 as described above can provide a low-cost, non-digital hearing aid. Further, in certain embodiments, for example, providing a hearing aid 900 as described above can provide a battery life of at least 7 days between charges. Also, in certain embodiments, for example, providing a hearing aid 900 as described above using a down converter as opposed to a silicon diode may provide increased battery life.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. An amplification circuit comprising:
   a first sub circuit configured to create a voltage drop across a plurality of resistors of an amplification sub circuit when a supply voltage is above a first voltage; and
   a second sub circuit configured to create a reverse voltage drop across the plurality of resistors of the amplification sub circuit when the supply voltage is below a second voltage,
   wherein the first and second sub circuits operate to maintain idling current within a range at the amplification sub circuit.

2. The amplification circuit of claim 1 comprising a plurality of transistors, wherein the voltage drop across the plurality of resistors is such that a base emitter voltage of the plurality of transistors is independent of supply voltage above the first voltage.

3. The amplification circuit of claim 1 comprising a plurality of transistors, wherein the reverse voltage drop across the plurality of resistors is such that a base emitter voltage of the plurality of transistors is independent of supply voltage below the second voltage.

4. The amplification circuit of claim 1, wherein the second sub circuit is disabled when the supply voltage is above a third voltage.

5. The amplification circuit of claim 4, wherein the first voltage is about 1.35 volts, the second voltage is about 1 volt, and the third voltage is about 1.2 volts.

6. The amplification circuit of claim 1, wherein the first sub circuit and the second sub circuit are provided on the same die and have the same temperature coefficient.

7. The amplification circuit of claim 1, comprising a first output and a second output, wherein the outputs are configured to be used with a two-terminal receiver.

8. The amplification circuit of claim 7, wherein the second output is configured to provide an output that is 180 degrees out of phase with the output provided by the first output.

9. The amplification circuit of claim 8, wherein the circuit provides an output without the use of output capacitors.

10. The amplification circuit of claim 1, wherein the circuit is configured to be used in a hearing aid.

11. A method for maintaining idling current of an amplification circuit within a range, the method comprising:
    creating, by a first sub circuit, a voltage drop across a plurality of resistors of an amplification sub circuit when a supply voltage is above a first voltage; and
    creating, by a second sub circuit, a reverse voltage drop across the plurality of resistors of the amplification sub circuit when the supply voltage is below a second voltage.

12. The method of claim 11 comprising a plurality of transistors, wherein the voltage drop across the plurality of resistors is such that a base emitter voltage of the plurality of transistors is independent of supply voltage above the first voltage, and wherein the reverse voltage drop across the plurality of resistors is such that a base emitter voltage of the plurality of transistors is independent of supply voltage below the second voltage.

* * * * *